(12) United States Patent
Lin et al.

(10) Patent No.: US 8,962,367 B2
(45) Date of Patent: Feb. 24, 2015

(54) MEMS DEVICE WITH RELEASE APERTURE

(71) Applicant: Taiwan Semiconductor Manufacturing Company, Ltd., Hsin-Chu (TW)

(72) Inventors: Chung-Hsien Lin, Hsinchu (TW); Chia-Hua Chu, Hsinchu County (TW); Chun-Wen Cheng, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/225,733

(22) Filed: Mar. 26, 2014

(65) Prior Publication Data

US 2014/0287548 A1 Sep. 25, 2014

Related U.S. Application Data

(62) Division of application No. 12/908,985, filed on Oct. 21, 2010, now Pat. No. 8,716,051.

(51) Int. Cl.
*H01L 21/00* (2006.01)
*B81C 1/00* (2006.01)

(52) U.S. Cl.
CPC .......... *B81C 1/00333* (2013.01); *B81C 1/0038* (2013.01); *B81C 2203/0136* (2013.01); *B81C 2203/0145* (2013.01)
USPC ................... 438/51; 438/50; 438/52; 438/53; 257/E21.587

(58) Field of Classification Search
CPC .............. B81C 1/00333; B81C 1/0038; B81C 1/00246; B81C 2203/0136; B81C 2203/0145; A61K 2300/00; H01L 2924/00; H01L 31/18; H01L 31/1804; H01L 2924/01079; H01L 2924/01006; H01L 2924/01013
USPC ............................... 438/50–53; 257/E21.587
See application file for complete search history.

(56) References Cited

U.S. PATENT DOCUMENTS

| 6,770,506 B2 | 8/2004 | Gogoi |
| 6,936,491 B2 | 8/2005 | Partridge et al. |
| 7,456,042 B2 | 11/2008 | Stark et al. |
| 7,687,297 B2 | 3/2010 | Heck et al. |
| 8,338,205 B2 | 12/2012 | Huang |

*Primary Examiner* — Michelle Mandala
(74) *Attorney, Agent, or Firm* — Haynes and Boone, LLP

(57) ABSTRACT

The present disclosure provides a method of fabricating a micro-electro-mechanical systems (MEMS) device. In an embodiment, a method includes providing a substrate including a first sacrificial layer, forming a micro-electro-mechanical systems (MEMS) structure above the first sacrificial layer, and forming a release aperture at substantially a same level above the first sacrificial layer as the MEMS structure. The method further includes forming a second sacrificial layer above the MEMS structure and within the release aperture, and forming a first cap over the second sacrificial layer and the MEMS structure, wherein a leg of the first cap is disposed between the MEMS structure and the release aperture. The method further includes removing the first sacrificial layer, removing the second sacrificial layer through the release aperture, and plugging the release aperture. A MEMS device formed by such a method is also provided.

20 Claims, 25 Drawing Sheets

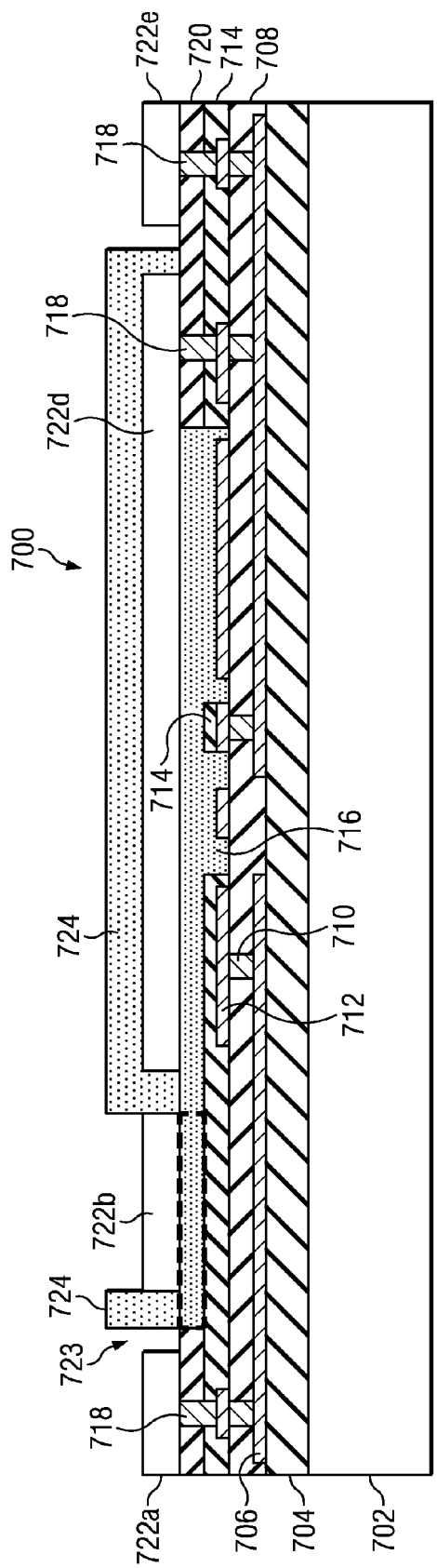
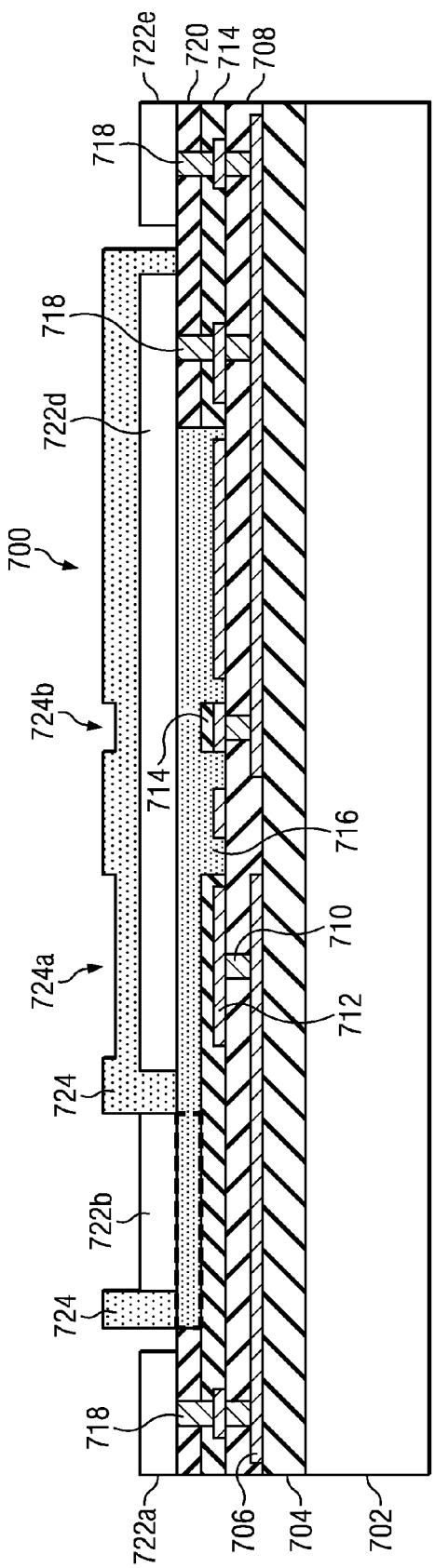
Fig. 7G
Fig. 7H

MEMS DEVICE WITH RELEASE APERTURE

CROSS-REFERENCE TO RELATED APPLICATIONS

This application is a divisional of U.S. application Ser. No. 12/908,985, which was filed on Oct. 21, 2010, now allowed, the entire disclosure of which is incorporated herein by reference.

BACKGROUND

Wafer level packaging (WLP) technology provides for the packaging of semiconductor devices at a wafer level. WLP is employed in a variety of technologies including 3D-integrated circuits (IC), chip scale package (CSP) devices, and micro-electro-mechanical systems (MEMS) for enhancing electrical properties and reducing costs. However, there are several limitations to the current WLP technology and the integration of the wafer fabrication and packaging processes it provides. The methods of packaging (e.g., protecting the device and providing interconnections) may not be compatible with the fabrication processes that are used to form the devices. Furthermore, solutions often require complicated packaging schemes that suffer from area/density penalties, contamination issues, and/or structural weakness.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2C-1 is a top view of the MEMS device at a stage of fabrication.

FIGS. 7A through 7D, 7E-2, and 7F-2 through 7R are cross-sectional views of a MEMS device at various stages of fabrication in accordance with another embodiment of the present disclosure, and FIGS. 7E-1 and 7F-1 are top views of the MEMS device at different stages of fabrication.

DETAILED DESCRIPTION

Figure 1:
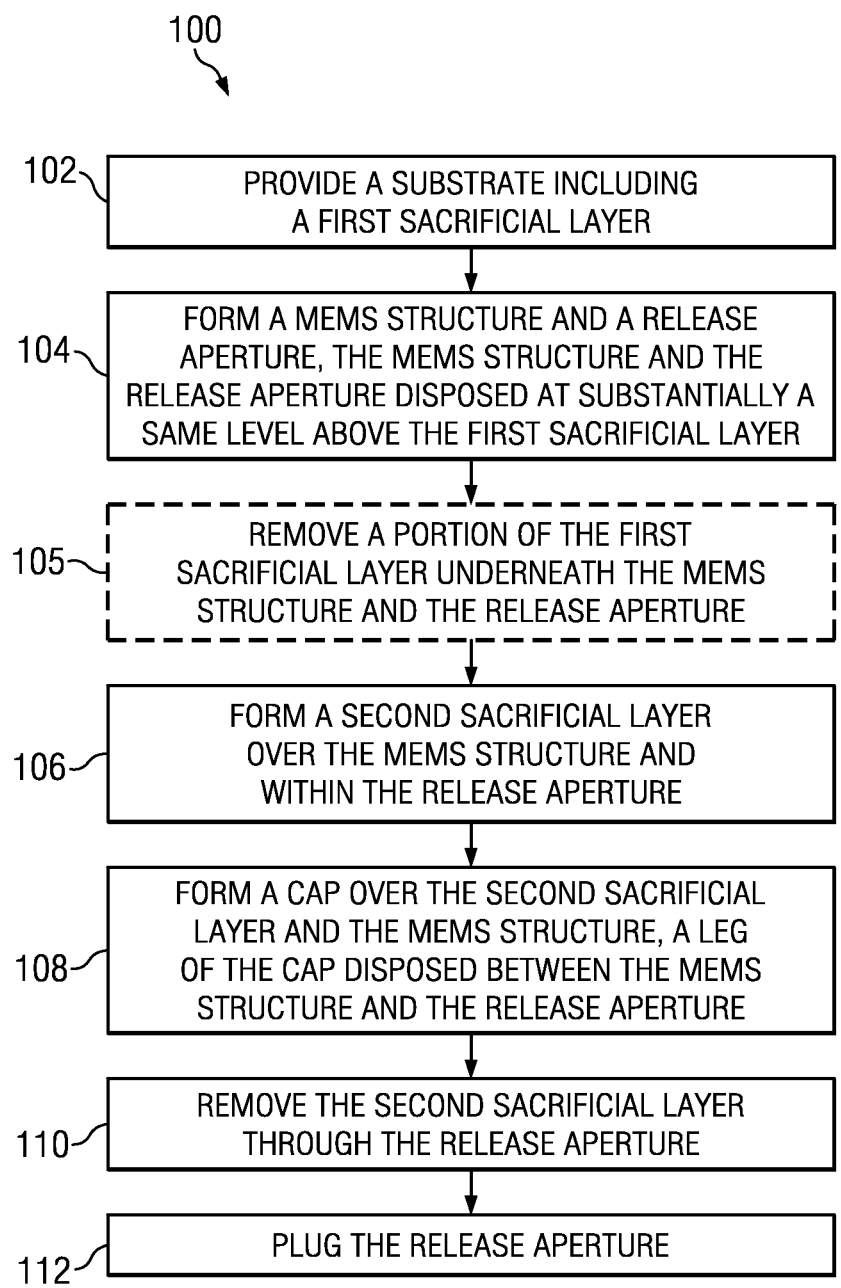
FIG. 1 is a flowchart of a method of fabricating a micro-electro-mechanical systems (MEMS) device in accordance with an embodiment of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

It is understood that several processing steps and/or features of a device may be only briefly described, such steps and/or features being well known to those of ordinary skill in the art. Also, additional processing steps or features can be added, and certain of the following processing steps or features can be removed and/or changed while still implementing the claims. Thus, the following description should be understood to represent examples only, and are not intended to suggest that one or more steps or features is required.

It is further understood that the present disclosure refers generally to WLP to refer to the packaging of a substrate. The substrates described herein may take various forms including but not limited to wafers (or portions thereof) having integrated circuits including those formed by CMOS-based processes, die, micro-electro-mechanical systems (MEMS) substrates, capping substrates, a single substrate with CMOS devices and MEMS devices formed thereon, and the like. In contrast, a carrier wafer may not include an integrated circuit. Furthermore, as described above, specific embodiments may be described herein which are exemplary only and not intended to be limiting. For example, embodiments that refer to a substrate being a MEMS substrate, a CMOS substrate, or the like are exemplary only and not intended to limit the disclosure to any particular technology.

FIG. 1 is a flowchart illustrating a method 100 for fabricating a MEMS device in accordance with an embodiment of the present disclosure. The method 100 begins at block 102 where a substrate including a first sacrificial layer is provided. The first sacrificial layer is provided between two substrate layers in one example. According to one aspect, the first sacrificial layer may include a buried oxide layer. At block 104, a MEMS structure and a release aperture are formed, such that the MEMS structure and the release aperture are disposed at substantially a same level above the first sacrificial layer. According to one aspect, the MEMS structure and the release aperture may be formed by patterning and etching the substrate layer above the first sacrificial layer. At block 105, a portion of the first sacrificial layer which is underneath the MEMS structure and the release aperture may be removed. At block 106, a second sacrificial layer is formed over the MEMS structure and within the release aperture. At block 108, a cap is formed over the second sacrificial layer and the MEMS structure, wherein a leg of the cap is disposed between the MEMS structure and the release aperture. At block 110, the second sacrificial layer may be removed through the release aperture. If the first and second sacrificial layers are comprised of the same or substantially similar material, both the first and second sacrificial layers may be removed simultaneously at this step and the step at block 105 delayed. At block 112, the release aperture is plugged, for example by a second cap.

Accordingly, method 100 provides for fabricating a MEMS structure sealed between a cap or a capping wafer and a substrate. The substrate may include various semiconductor devices, and/or other suitable active and/or passive devices. Example semiconductor devices include integrated circuits including a metal-insulator-semiconductor field effect transistor (MOSFET) including complementary MOSFET (CMOS) features, CIS, and/or other suitable active and/or passive devices. In an embodiment, the substrate may include an integrated circuit (or portion thereof) designed and formed using a CMOS-based process. The MEMS structure may be fabricated from a silicon wafer and includes MEMS features and/or functionalities. A substrate having a device (e.g., integrated circuit) formed by other semiconductor fabrication technologies is also within the scope of the described method.

According to one aspect, the substrate of the MEMS structure may include a silicon wafer and may also include other elementary semiconductor, such as germanium, or a compound semiconductor, such as silicon carbide, gallium arsenic, indium arsenide, and/or indium phosphide. According to another aspect, the first and second sacrificial layers may be comprised of a metal (e.g., aluminum, aluminum copper, and/or alloys thereof), a polymer (e.g., a photoresist material), or an oxide (e.g., silicon oxide). According to another aspect, the cap over the second sacrificial layer and the MEMS structure, and a second cap used to plug the release aperture, may be comprised of a polysilicon, an amorphous silicon, a nitride (e.g., silicon nitride), a metal, or an oxide (e.g., silicon oxide). The various structures in the method 100 described above may be formed by various deposition, pattern, and etch techniques conventionally known in the art.

Figure 2A:
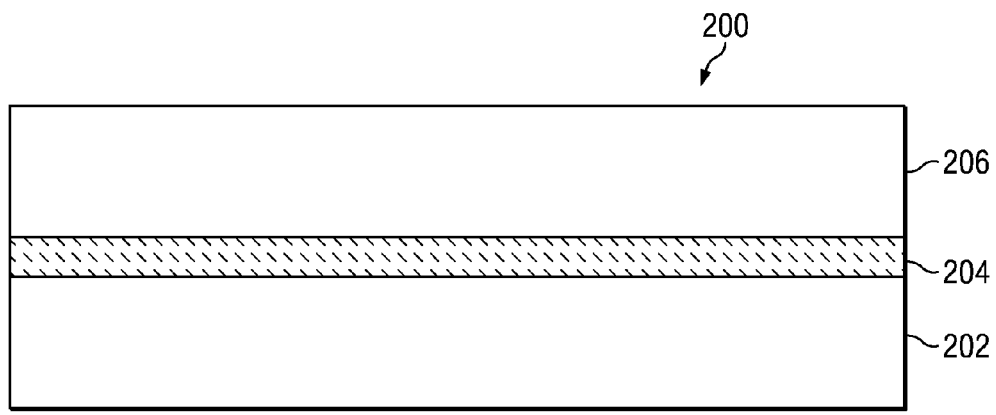
FIGS. 2A through 2B and 2C-2 through 2J are cross-sectional views of a MEMS device at various stages of fabrication in accordance with an embodiment of the present disclosure.
Figure 2B:
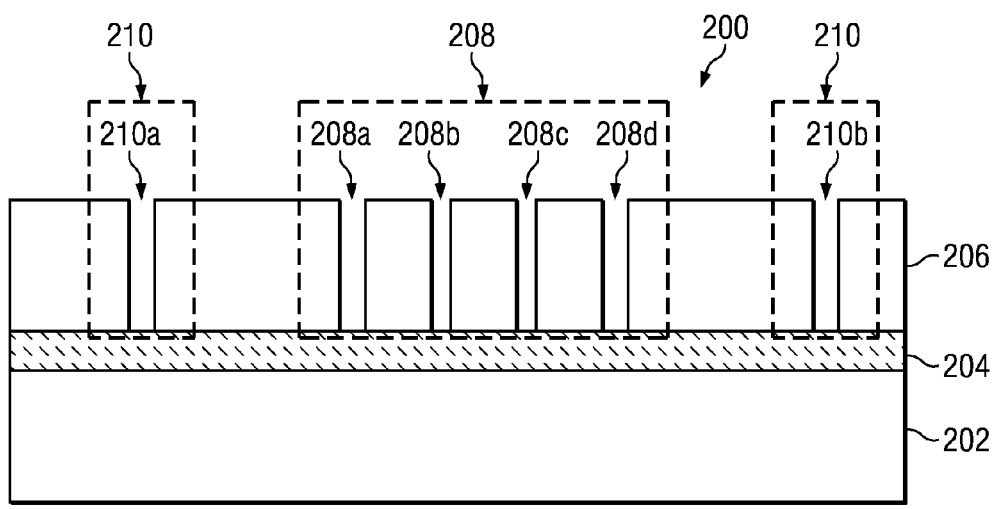
Figures 1, 2C:
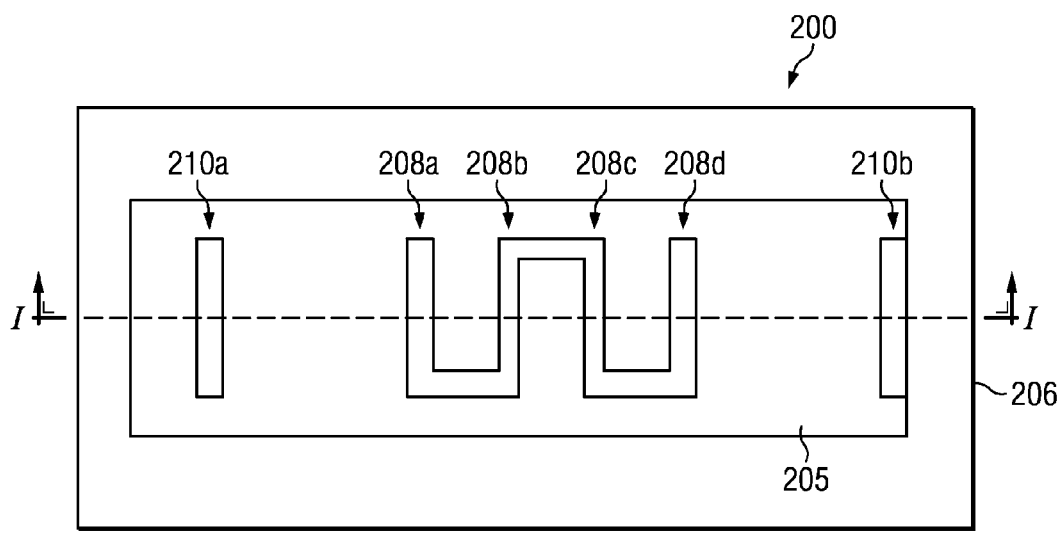

Referring now to FIGS. 2A-2J, FIGS. 2A through 2B and 2C-2 through 2J are cross-sectional views of a MEMS device 200 at various stages of fabrication in accordance with an embodiment of the present disclosure, and FIG. 2C-1 is a top view of the MEMS device 200 at a stage of fabrication.

FIG. 2A illustrates a substrate 202 including a first sacrificial layer 204 (e.g., a buried oxide layer). A portion of substrate 202 above the first sacrificial layer 204 is denoted by reference number 206. In one example, a MEMS device is formed on a silicon-on-insulator (SOI) wafer. According to one aspect, substrate 202, 206 is comprised of single crystal silicon. According to another aspect, substrate 202, 206 may be comprised of quartz, glass, or include CMOS features. Substrate 202, 206 may be comprised of other materials and include other structures as noted above, such as germanium, or a compound semiconductor, such as silicon carbide, gallium arsenic, indium arsenide, and/or indium phosphide. First sacrificial layer 204 may be comprised of various materials, such as a metal, a polymer, an oxide, or a combination thereof, but the first sacrificial layer 204 is comprised of a material which is selectively removable from substrate 206.

FIG. 2B illustrates a patterned etch of the substrate 206 to form or define openings 208a-208d, and 210a-210b, above the first sacrificial layer 204 to form a micro-electro-mechanical systems (MEMS) structure 208 and a release aperture 210, respectively, at substantially the same level above the first sacrificial layer 204. More or less openings than those illustrated in FIG. 2B are within the scope of the present disclosure. In this first masking step, various conventional pattern and etch techniques and tools may be used for the patterned etch of the substrate 206. In one example, an isotropic oxide etcher with a fluorinated etchant gas may be used in conjunction with a patterned photoresist for the patterned etch of the substrate 206. In another example, deep reactive-ion etching may be used to form openings 208a-208d, and 210a-210b. Other manufacturing techniques used to pattern the substrate may include photolithography processing and/or etching to pattern the substrate. According to one aspect, the diameter of the release aperture 210 can be advantageously made small to provide a mechanically stronger device and package because the topography of the etched substrate is simple and at substantially the same level. In one example, the release aperture 210 is formed to have a diameter between about 0.5, micron and about 2, micron in one example, and is less than 1.5, microns in another example.

Figures 2, 2C:
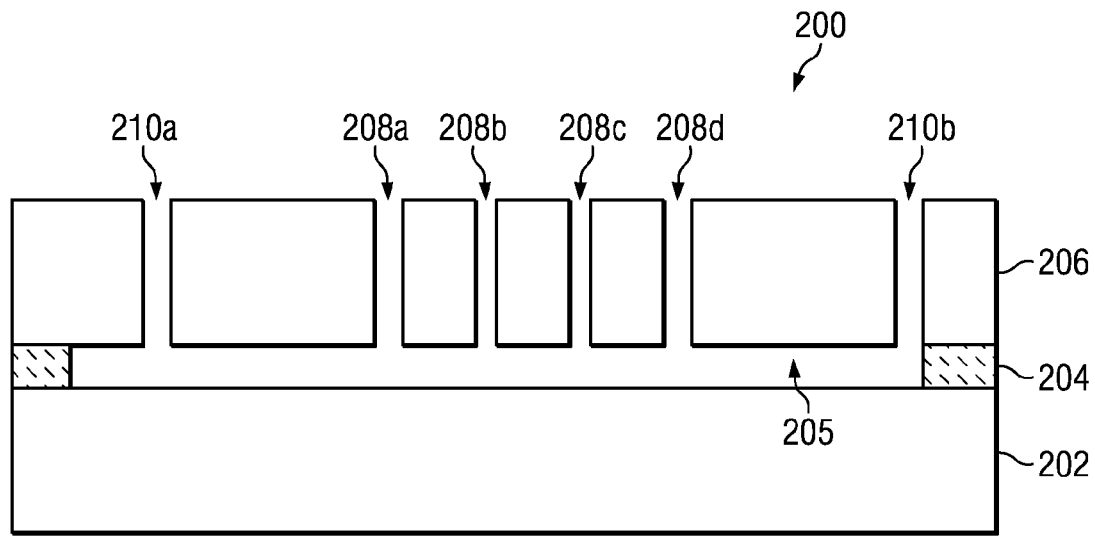

FIG. 2C-1 illustrates a top view of the MEMS device 200, and FIG. 2C-2 illustrates a cross-sectional view of the MEMS device 200 along line I-I after a portion of the first sacrificial layer 204 is removed to form a first sacrificial layer opening 205 above substrate 202. According to one aspect, the first sacrificial layer 204 may be removed by a selective etch, such as by a vapor HF etch.

Figure 2D:
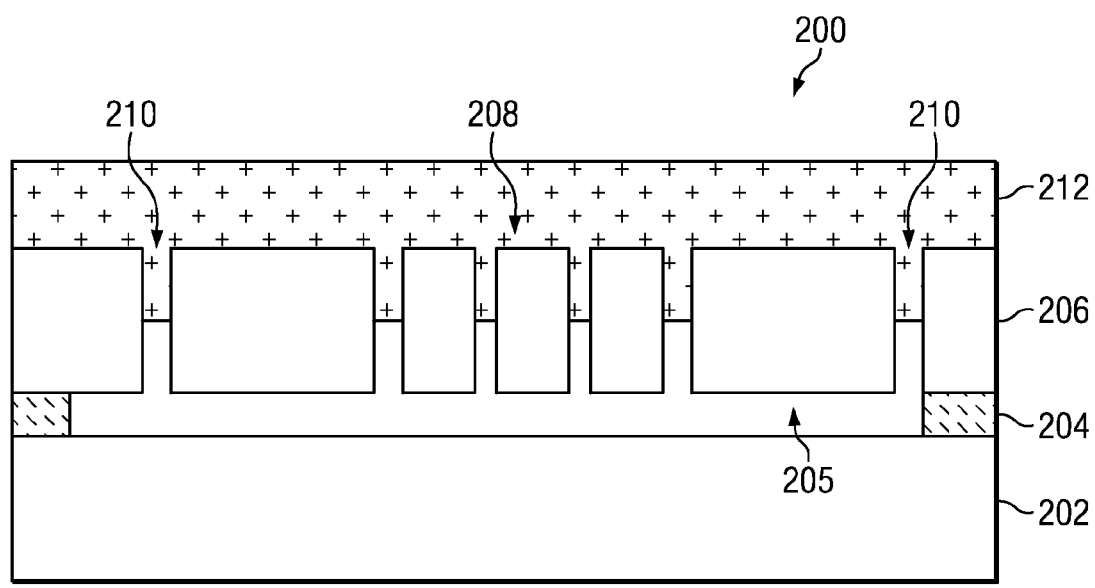

FIG. 2D illustrates the formation of a second sacrificial layer 212 over MEMS structure 208 and within release aperture 210. According to one aspect, second sacrificial layer 212 may be comprised of various materials, such as a metal (e.g., aluminum, aluminum copper, etc.), a polymer (e.g., photoresist, etc.), or an oxide (e.g., silicon oxide, etc.), but is comprised of a material which is selectively removable from substrate 206 (MEMS structure 208). According to another aspect, second sacrificial layer 212 may be formed by various conventional techniques and tools, such as by chemical vapor deposition (CVD), low pressure CVD (LPCVD), physical vapor deposition (PVD), plating, evaporation, electron beam evaporation (E-gun), ion beam, energy beam, combinations thereof, and/or other suitable deposition processes. Second sacrificial layer 212 may subsequently undergo a planarization process, such as by a chemical mechanical polish (CMP) process.

Figure 2E:
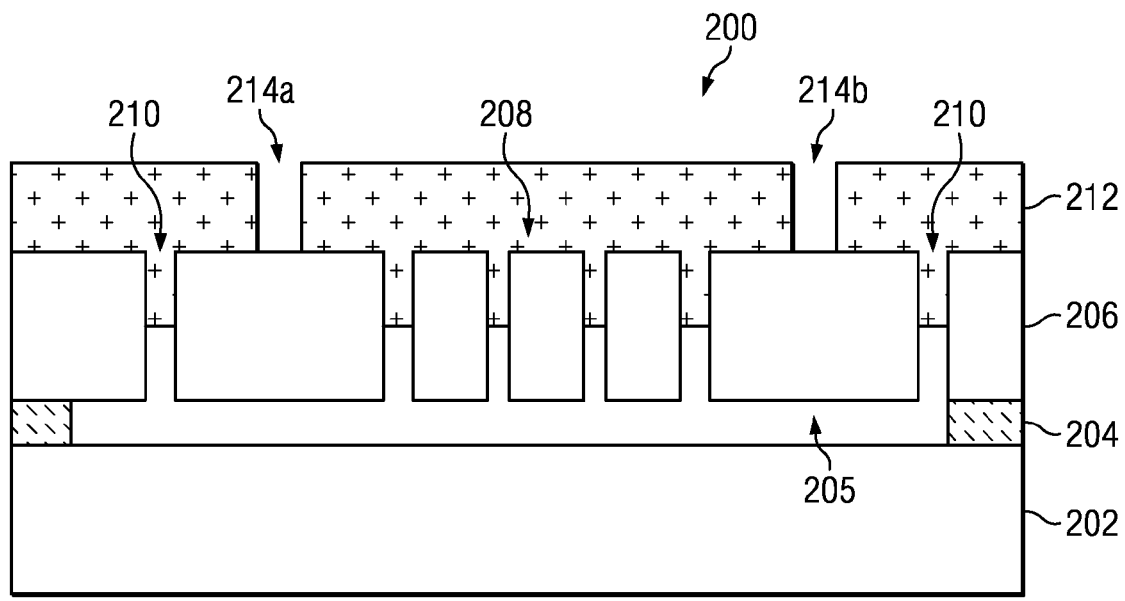

FIG. 2E illustrates a patterned etch of the second sacrificial layer 212 to form openings 214a, and 214b. In this second masking step, various conventional pattern and etch techniques and tools may be used for the patterned etch of the second sacrificial layer 212. In one example, an isotropic oxide etcher with a fluorinated etchant gas may be used in conjunction with a patterned photoresist for the patterned etch of the second sacrificial layer 212. In another example, deep reactive-ion etching may be used to form openings 214a,, 214b.

Figure 2F:
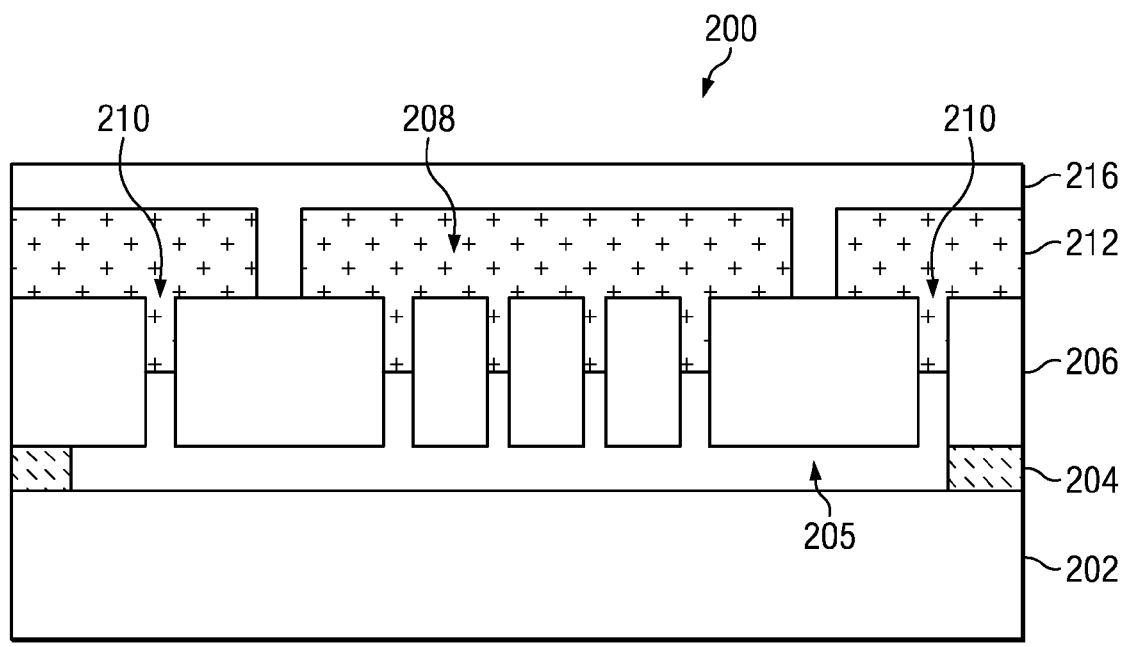
Figure 2G:
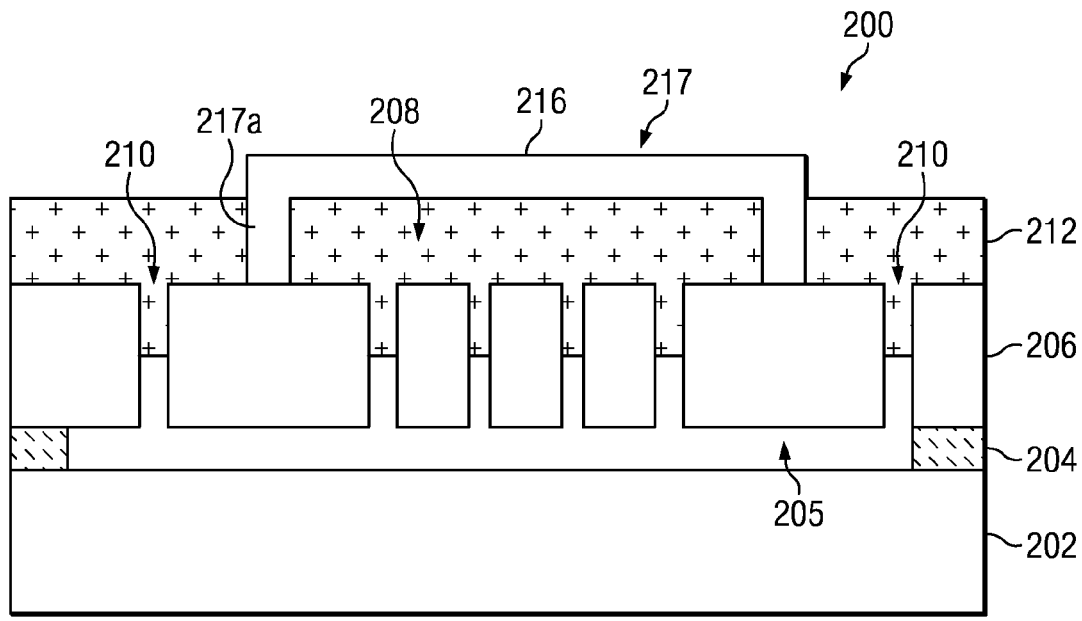

FIGS. 2F and 2G illustrate the deposition and etch in a third masking step, respectively, of a capping layer 216 over the second sacrificial layer 212 and the MEMS structure 208, to form a cap 217. Cap 217 includes a leg 217a, which is disposed between the MEMS structure 208 and the release aperture 210. Leg 217a, acts as a stand-off feature configured to provide the appropriate separation between the top of the cap 217 and the MEMS structure. According to one aspect, cap 217 may be comprised of various materials, such as polysilicon, amorphous silicon, silicon nitride, silicon oxide, a metal, or combinations thereof, and may be deposited and etched by various conventional methods and tools.

Figure 2H:
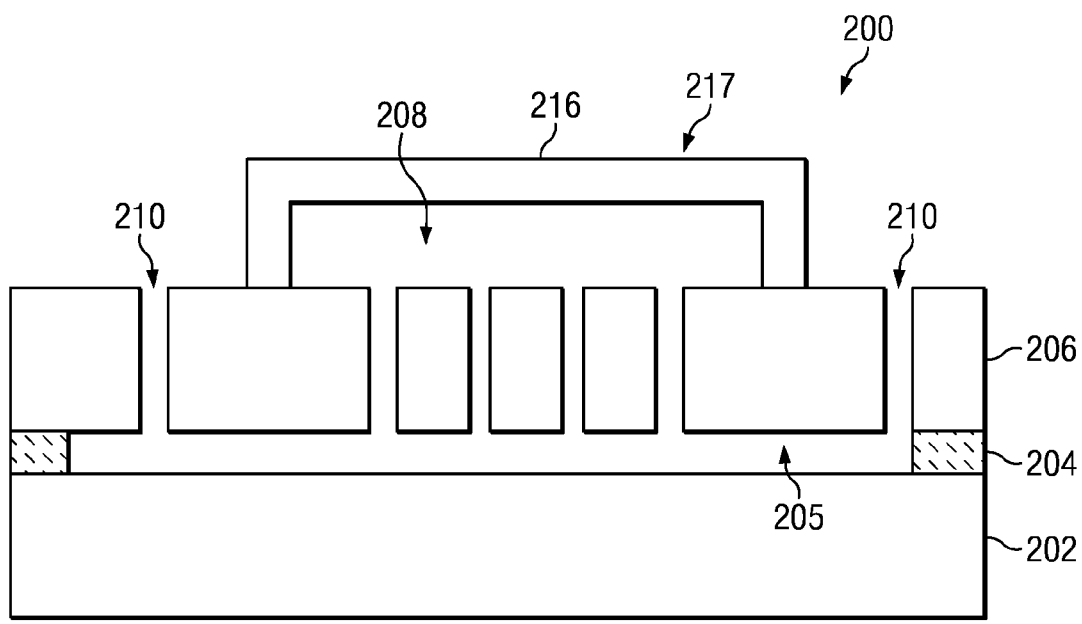

FIG. 2H illustrates the removal of the second sacrificial layer through the release aperture 210 by a selective etch, such as by a vapor HF etch, thus releasing the MEMS structure 208. Release aperture 210 is located apart from the MEMS structure 208 at substantially the same level above first sacrificial layer opening 205, and the second sacrificial layer (and optionally the first sacrificial layer) is removed underneath and to the side of the cap 217 and the MEMS structure 208. Advantageously, since cap 217 does not include a release aperture but is mechanically and materially continuous without a discontinuity, the likelihood of contamination during subsequent processing is reduced while the structural strength of the cap packaging over the MEMS structure is increased.

Figure 2I:
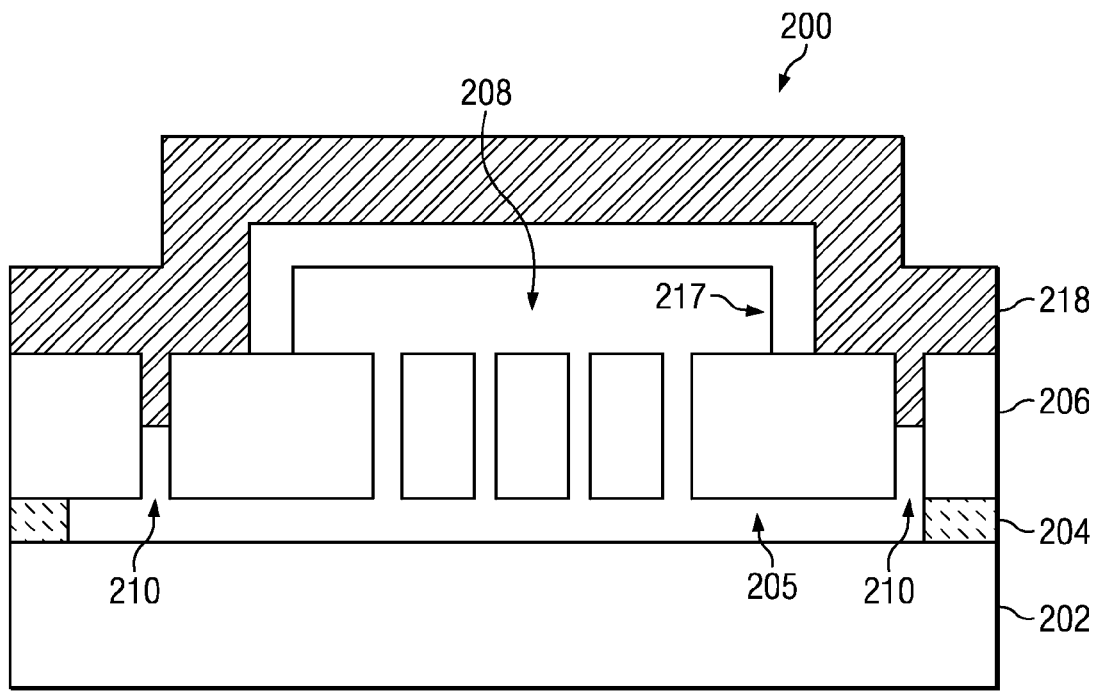
Figure 2J:
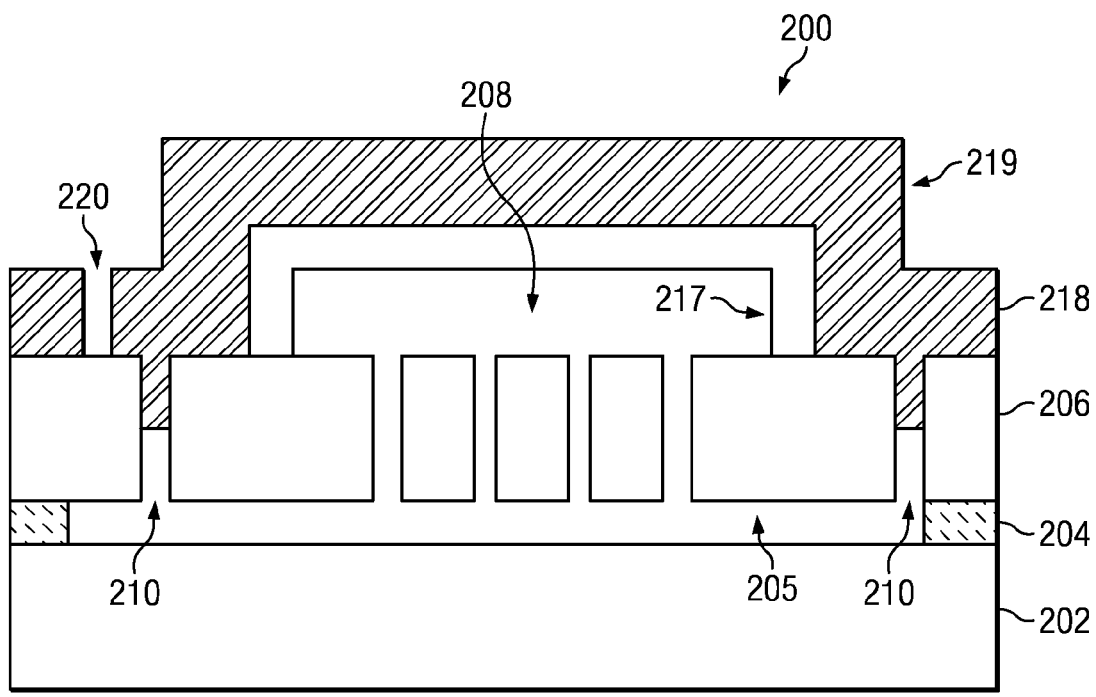

FIGS. 2I and 2J illustrate the deposition and etch in a fourth masking step, respectively, of a second capping layer 218 over cap 217 and within release aperture 210, to form a second cap 219 that plugs release aperture 210 while also providing reinforcement over the MEMS structure 208. Capping layer 218 may then be etched to form an opening 220, thus isolating second cap 219 and encapsulating MEMS structure 208 within a cavity formed between cap 217 and substrate 202. In other words, cap 219 provides for reinforcement of the packaging while also sealing the MEMS structure 208. MEMS structure 208 is sandwiched between cap 217 and semiconductor substrate 202, which in one example may be one of a CMOS wafer or a carrier wafer, and the resonator element of MEMS structure 208 is sealed within a cavity between the substrate 202 and the cap 217, which may include stand-off features or legs for formation of the cavity for the MEMS resonator element. According to one aspect, second capping layer 218 and second cap 219 may be comprised of a silicon nitride, a silicon oxide, a metal, or combinations thereof, and may be deposited and etched by various applicable conventional processes and tools.

Advantageously, there are no apertures in the cap 217, thus providing a structurally strong cap without discontinuities in shape or material over the MEMS structure. Furthermore, since the release aperture is set apart from the cap and the MEMS structure 208, the possibility of contaminating the MEMS structure is reduced. The present disclosure also provides for a release aperture 210 having a smaller diameter than prior release apertures, which is advantageous for structural strength and integrity of the MEMS device. The release aperture may be defined to have a smaller diameter because the release aperture is defined at substantially the same level as the MEMS structure above the first sacrificial layer.

Figure 3A:
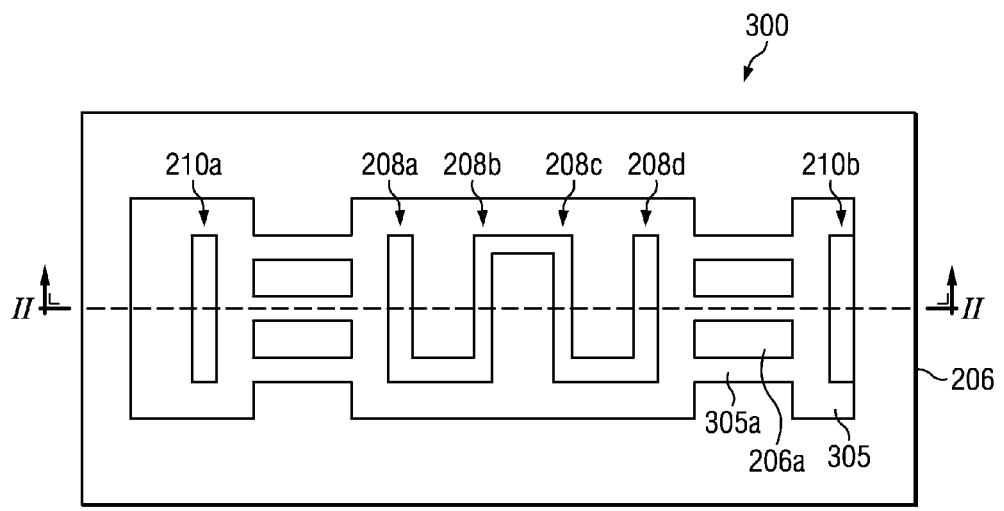
FIGS. 3A and 3B are a top view and a cross-sectional view, respectively, of a MEMS device at a stage of fabrication in accordance with another embodiment of the present disclosure.
Figure 3B:
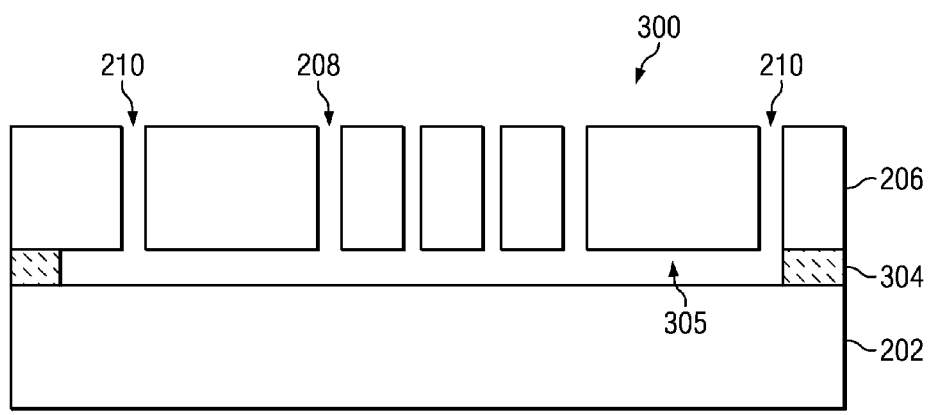

Referring now to FIGS. 3A and 3B, a top view and a cross-sectional view are illustrated, respectively, of a MEMS device 300 at a stage of fabrication in accordance with another embodiment of the present disclosure. The structure shown in FIGS. 3A and 3B are fabricated by substantially the same steps and processes and include substantially similar structures as illustrated in and described above with respect to FIGS. 2A-2J. Accordingly, the features and steps for fabrication of the structure shown in FIGS. 3A and 3B as described above may not be repeated here to avoid prolix description but are fully applicable in this embodiment. The same or substantially similar elements as those illustrated in FIGS. 2A-2J are numbered the same or similarly and have the same or similar structure, function, and fabrication procedure as described above with respect to FIGS. 2A-2J.

FIG. 3A illustrates a top view of the MEMS device 300, and FIG. 3B illustrates a cross-sectional view of the MEMS device 300 along line II-II after a portion of a first sacrificial layer 304 is removed to form a first sacrificial layer opening 305 above substrate 202. According to one aspect, the first sacrificial layer 304 may be removed by a selective etch, such as by a vapor HF etch. In this embodiment, the first sacrificial layer 304 is a pre-patterned layer, such as a pre-patterned buried oxide layer, so that when the first sacrificial layer is removed, the first sacrificial layer opening 305 includes a vertically-aligned array of horizontal passages 305a with substrate 206a, between adjacent horizontal passages 305a,, thus increasing the isolation between the MEMS structure 208 and the remainder of the device, such as the packaging and outside of the packaging.

Figure 4:
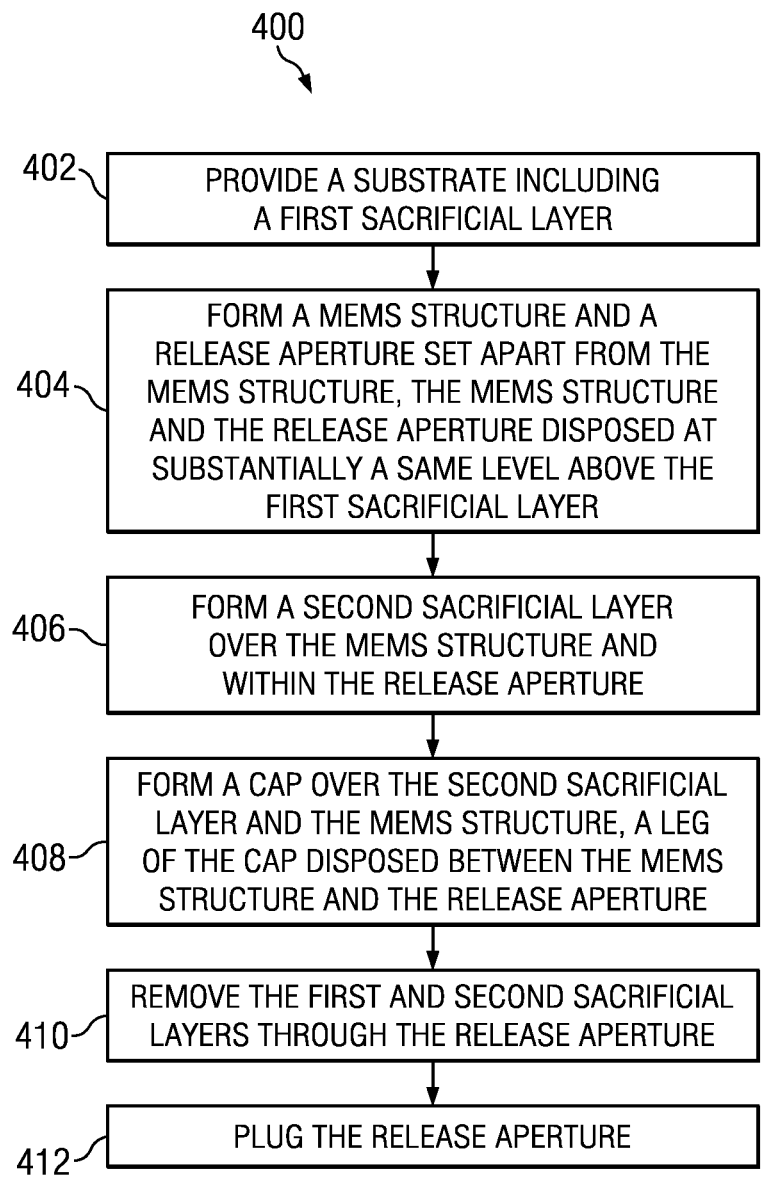
FIG. 4 is a flowchart of a method of fabricating a micro-electro-mechanical systems (MEMS) device in accordance with another embodiment of the present disclosure.

FIG. 4 is a flowchart of a method 400 for fabricating a micro-electro-mechanical systems (MEMS) device in accordance with another embodiment of the present disclosure. Similar to the method 100 described above with respect to FIG. 1, the method 400 begins at block 402 where a substrate including a first sacrificial layer is provided. The first sacrificial layer is provided between two substrate layers in one example. According to one aspect, the first sacrificial layer may include a buried oxide layer. At block 404, a MEMS structure and a release aperture are formed, such that the MEMS structure and the release aperture are disposed at substantially a same level above the first sacrificial layer. According to one aspect, the MEMS structure and the release aperture may be formed by patterning and etching the substrate layer above the first sacrificial layer. At block 406, a second sacrificial layer is formed over the MEMS structure and within the release aperture. At block 408, a cap is formed over the second sacrificial layer and the MEMS structure, wherein a leg of the cap is disposed between the MEMS structure and the release aperture. In this embodiment, at block 410, the first and second sacrificial layers are both removed in a single step through the release aperture. In this case, the first and second sacrificial layers are comprised of the same or substantially similar material or are both selectively removable such that both the first and second sacrificial layers may be removed simultaneously at this step without attacking the MEMS structure and layer. At block 412, the release aperture is plugged, for example by a second cap.

Figure 5A:
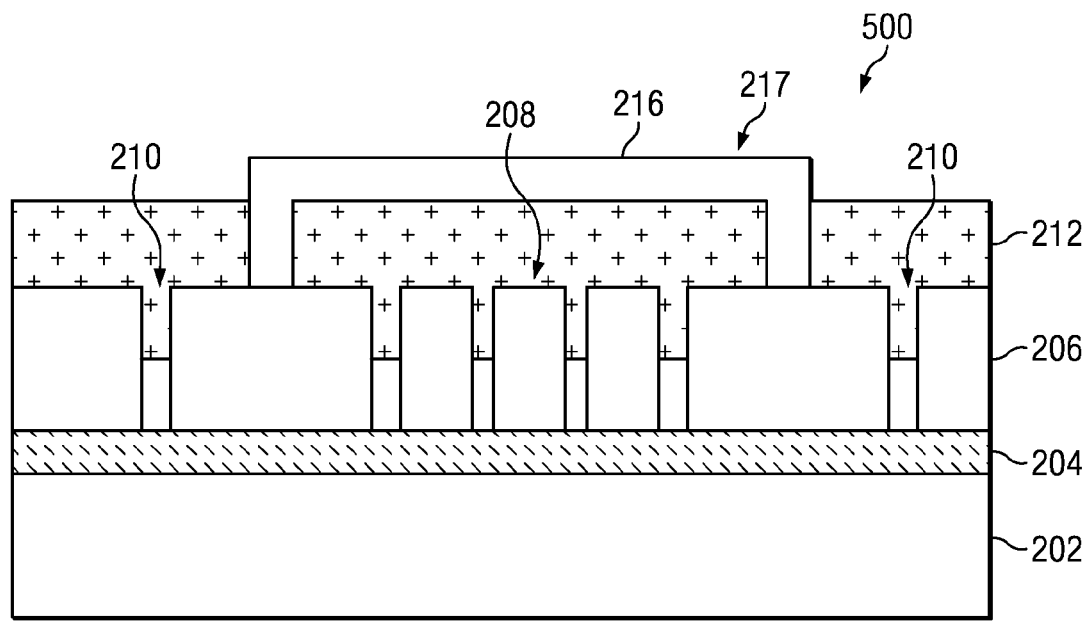
FIGS. 5A and 5B are cross-sectional views of a MEMS device at various stages of fabrication in accordance with another embodiment of the present disclosure.
Figure 5B:
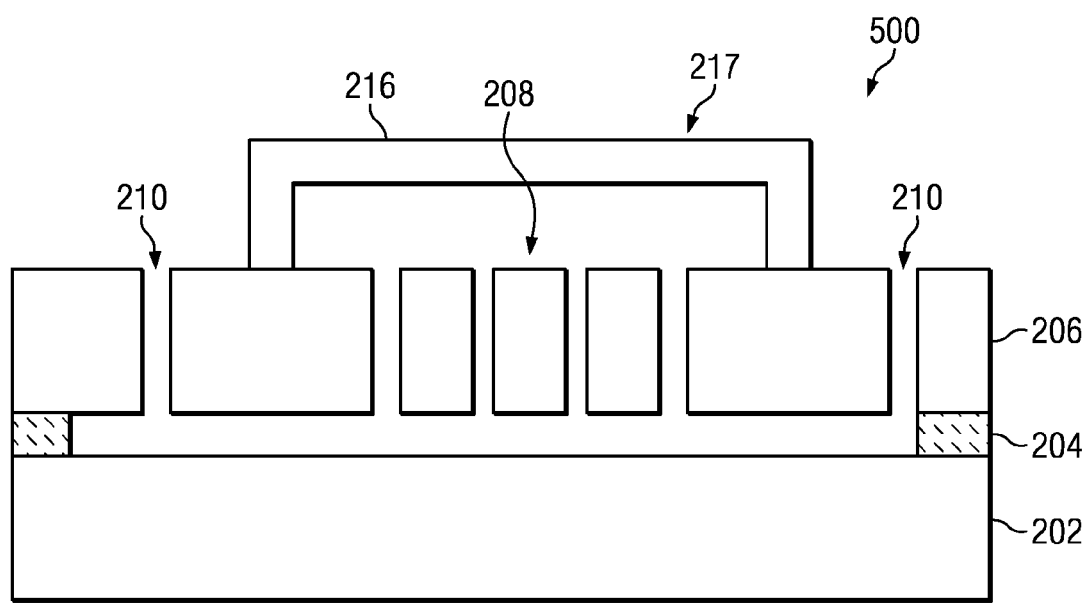

Referring now to FIGS. 5A and 5B, cross-sectional views of a MEMS device 500 at various stages of fabrication are illustrated in accordance with another embodiment of the present disclosure as shown in FIG. 4. The same or substantially similar elements as those illustrated in FIGS. 2A-2J are numbered the same or similarly in FIGS. 5A and 5B and have the same or similar structure, function, and fabrication procedure. Although the same or similar features of FIGS. 5A and 5B may not be described here to avoid prolix description, the same or similar structures and features as those described above with respect to FIGS. 2A-2J are applicable in this embodiment.

FIG. 5A illustrates MEMS device 500 at a stage of fabrication including both the first and second sacrificial layers 204 and 212 below and above the MEMS structure 208, respectively. FIG. 5B then illustrates the simultaneous removal of both the first and second sacrificial layers 204 and 212 through the release aperture 210 by a selective etch, such as by a vapor HF etch, thus releasing the MEMS structure 208. First and second sacrificial layers 204 and 212 may be comprised of the same, substantially similar, or different materials, but are comprised of materials selectively removable from the MEMS structure 208 and MEMS layer.

Figure 6:
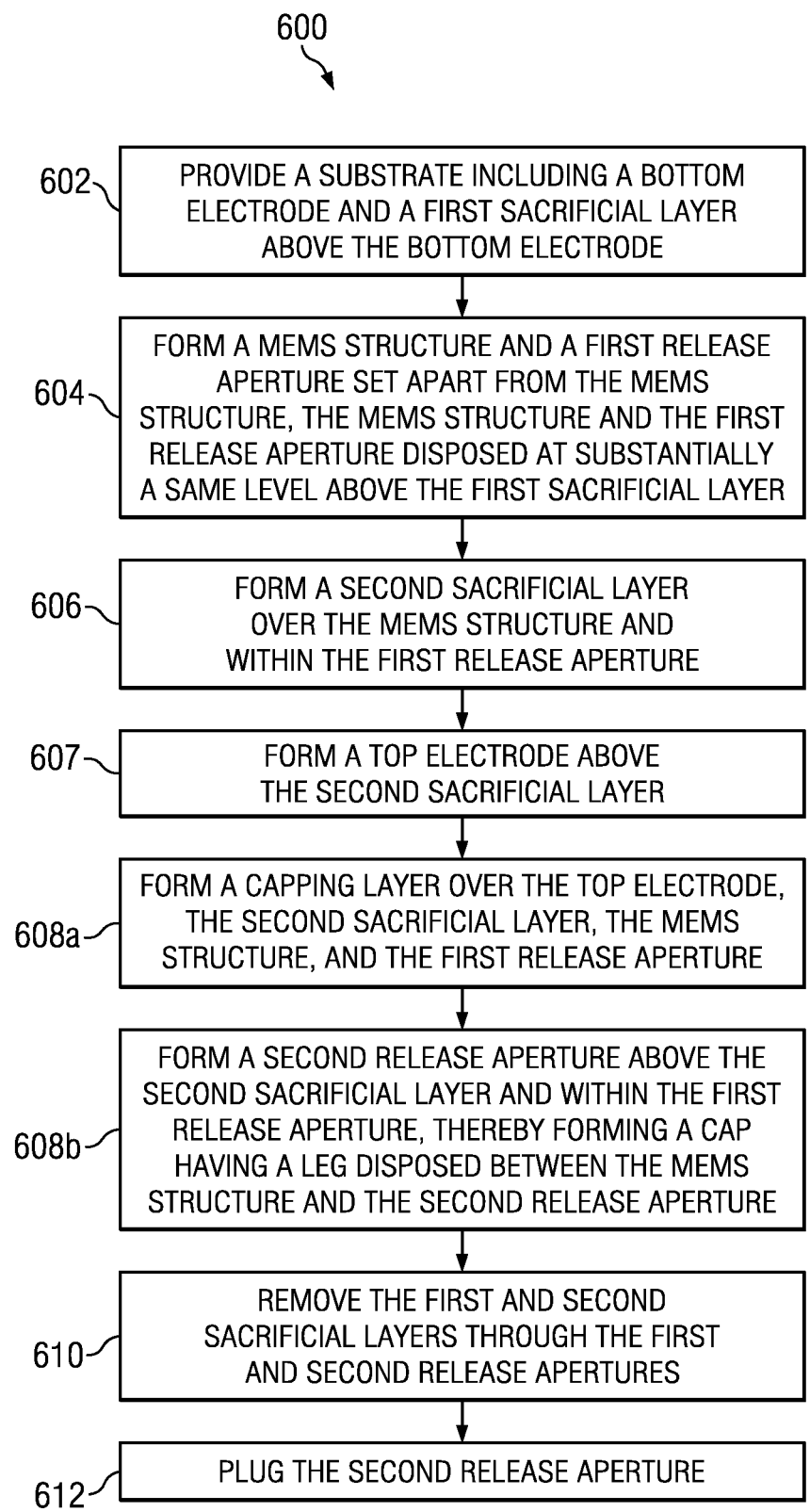
FIG. 6 is a flowchart of a method of fabricating a micro-electro-mechanical systems (MEMS) device in accordance with yet another embodiment of the present disclosure.

Referring now to FIG. 6, a flowchart illustrates a method 600 of fabricating a micro-electro-mechanical systems (MEMS) device in accordance with yet another embodiment of the present disclosure. Similar to the methods 100 and 400 described above with respect to FIGS. 1 and 4, with the same or similar features as in methods 100 and 400 being applicable here, the method 600 begins at block 602 where a substrate including a first sacrificial layer is provided. However, in this embodiment, the substrate further includes a bottom electrode and the first sacrificial layer is provided above the bottom electrode. At block 604, a MEMS structure and a release aperture are formed, such that the MEMS structure and the release aperture are disposed at substantially a same level above the first sacrificial layer. According to one aspect, the MEMS structure and the release aperture may be formed by patterning and etching a MEMS layer above the first sacrificial layer. At block 606, a second sacrificial layer is formed over the MEMS structure and within the release aperture. At block 607, a top electrode is formed above the second sacrificial layer. At block 608a,, a capping layer is formed over the top electrode, the second sacrificial layer, the MEMS structure, and the first release aperture. At block 608b,, a second release aperture is formed in the capping layer above the second sacrificial layer and the first release aperture, thereby forming a cap having a leg disposed between the MEMS structure and the second release aperture. At block 610, the first and second sacrificial layers are both removed in a single step through the first and second release apertures. In this case, the first and second sacrificial layers are comprised of the same or substantially similar material or are both selectively removable such that both the first and second sacrificial layers may be removed simultaneously at this step without attacking the MEMS layer. At block 612, the second release aperture is plugged, for example by a second cap.

Figure 7A:
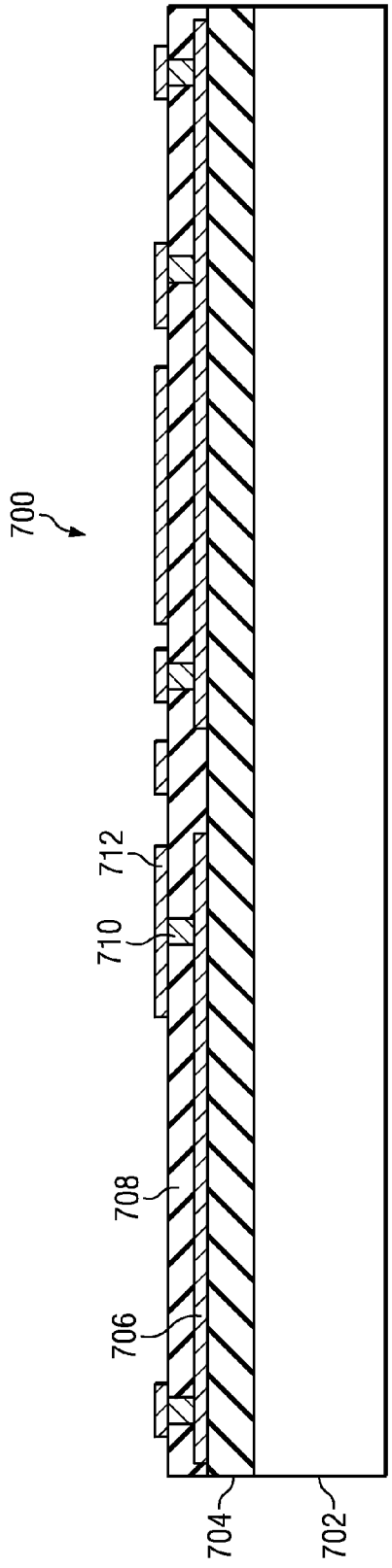
Figure 7B:
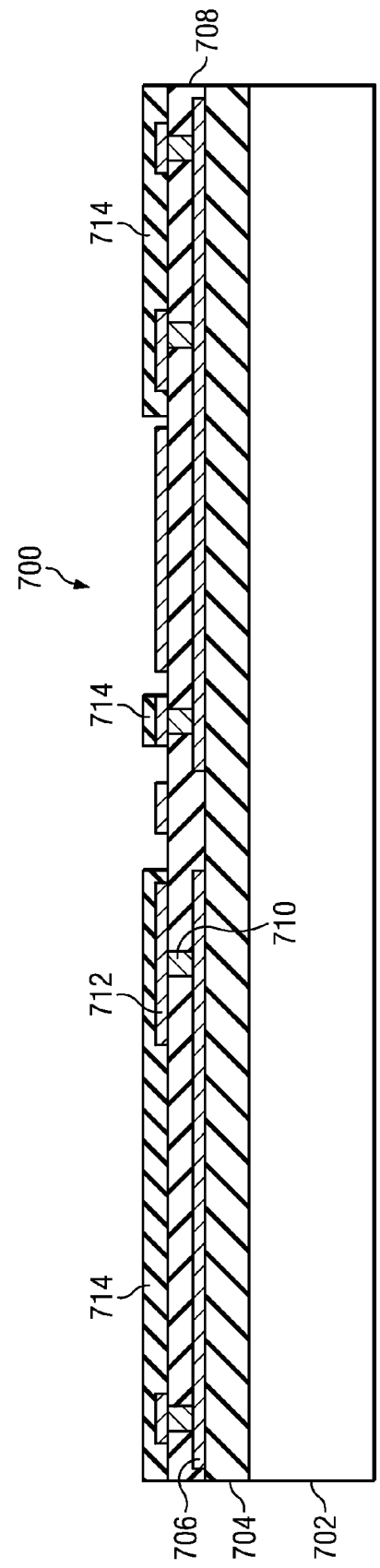
Figure 7C:
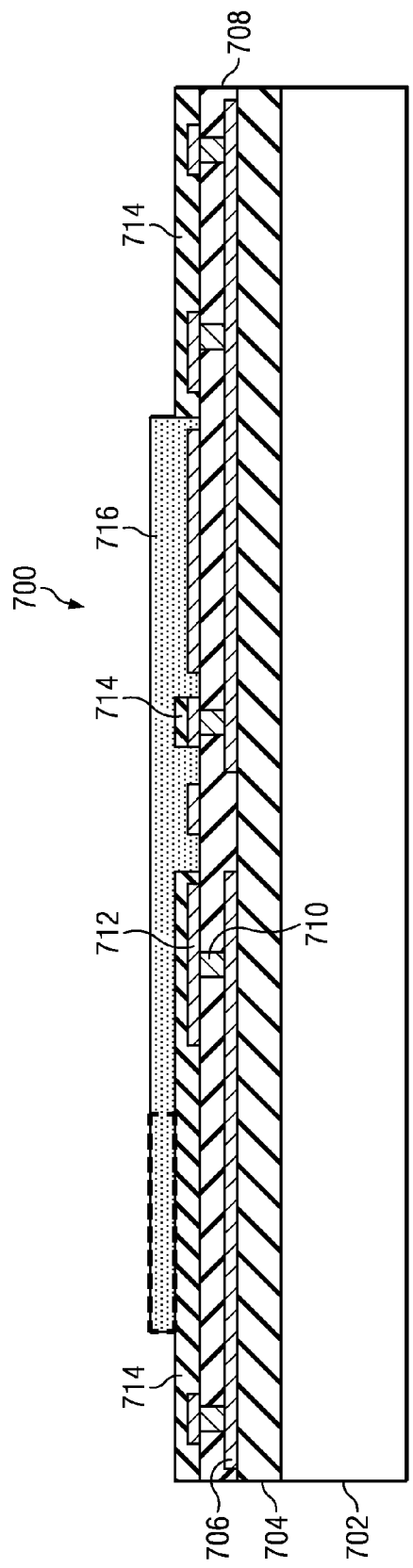
Figure 7D:
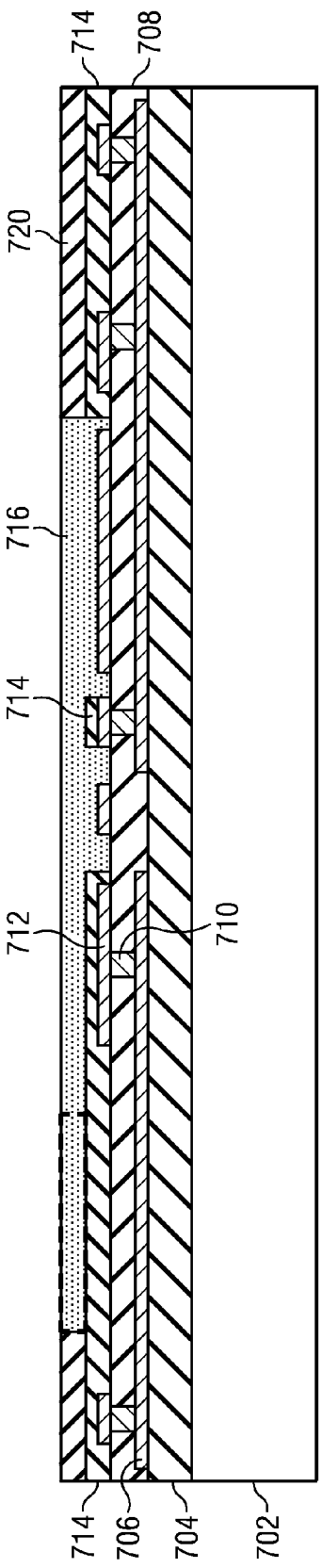
Figures 1, 7E:
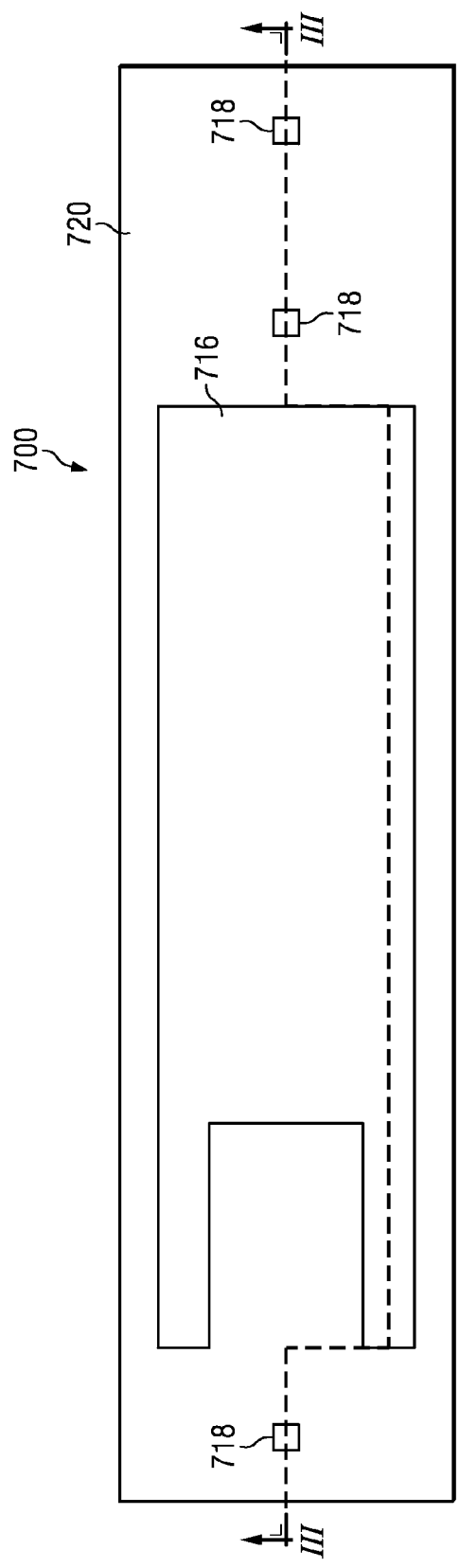
Figures 2, 7E:
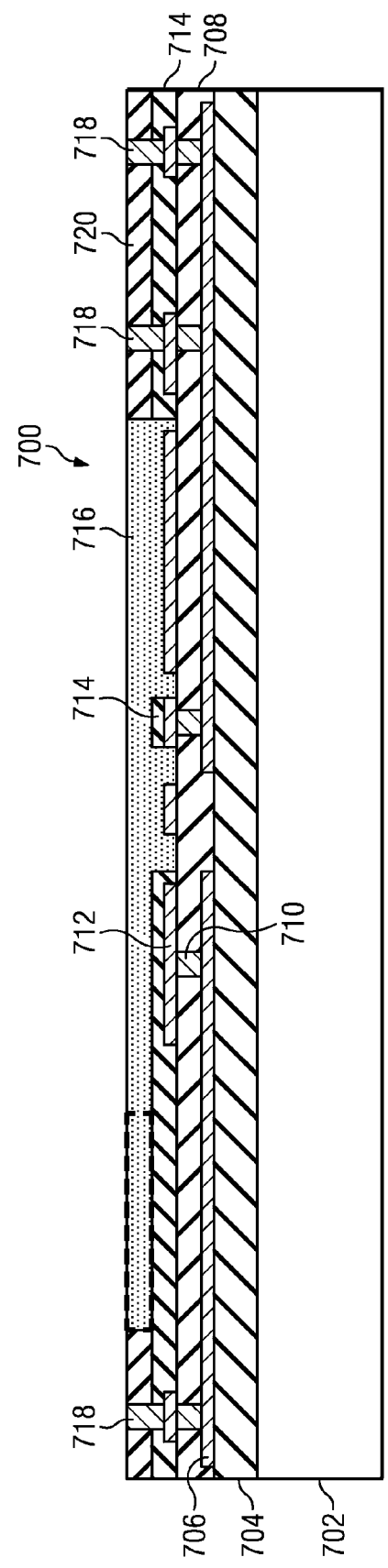
Figures 1, 7F:
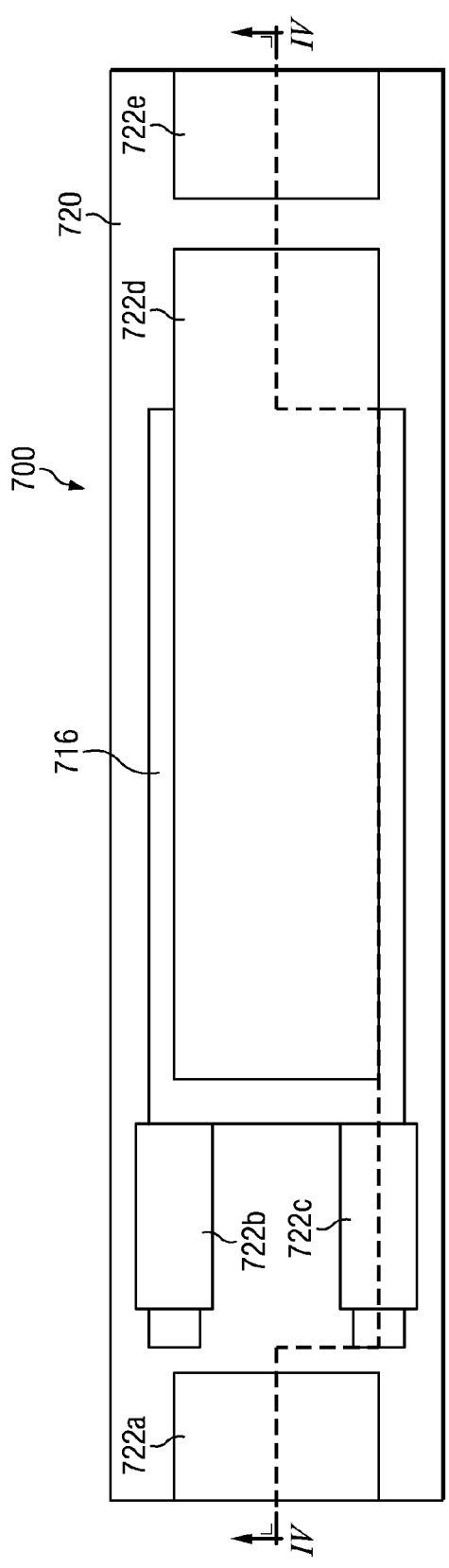
Figures 2, 7F:
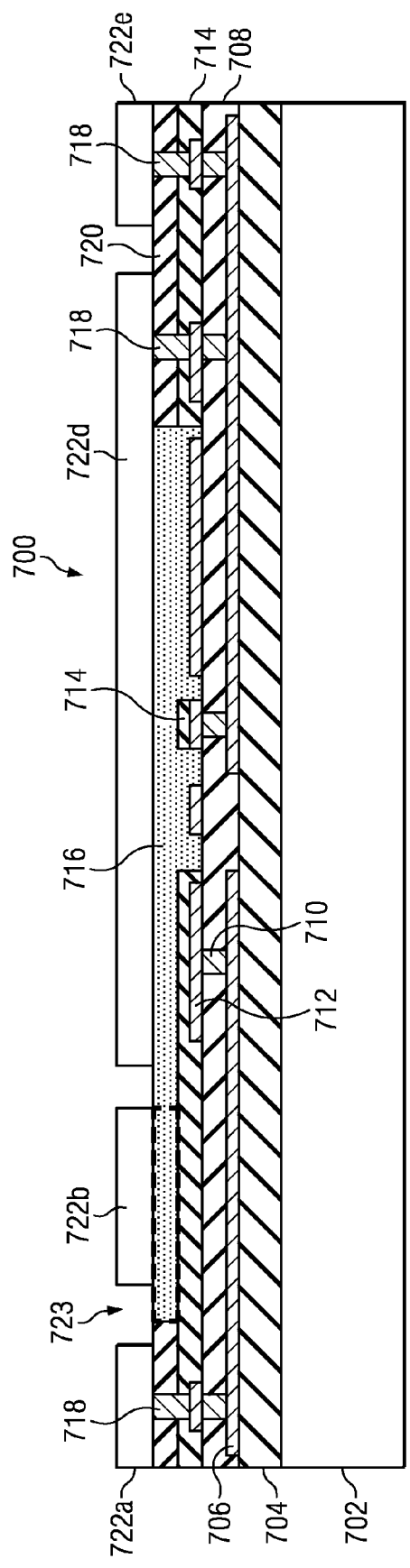

Referring now to FIGS. 7A through 7D, 7E-2, and 7F-2 through 7R, cross-sectional views of a MEMS device 700 at various stages of fabrication are illustrated in accordance with another embodiment of the present disclosure, and FIGS. 7E-1 and 7F-1 are top views of the MEMS device 700 at different stages of fabrication.

FIG. 7A illustrates MEMS device 700 including a substrate 702, a dielectric layer 704, metal lines 706, a dielectric layer 708, metal vias 710, and bottom electrodes 712, such as bottom actuation electrodes and bottom signal electrodes. In one example, substrate 702 includes a silicon-on-insulator (SOI) wafer. According to another aspect, substrate 702 is comprised of single crystal silicon. According to another aspect, substrate 702 may be comprised of quartz, glass, or include CMOS features. Substrate 702 may be comprised of other materials and include other structures as noted above. According to one aspect, dielectric layers 704 and 708 are comprised of the same material, such as silicon oxide in one example, but may be comprised of different materials in other embodiments.

FIG. 7B illustrates a dielectric layer 714 deposited over bottom electrodes 712 and then a subsequent patterning and etch of the dielectric layer 714 to isolate or expose certain bottom electrodes 712, such as to isolate a bottom signal electrode and to expose a bottom actuation electrode. According to one aspect, dielectric layer 714 is comprised of the same material as dielectric layers 704 and 708, such as silicon oxide in one example, but may be comprised of a different material in other embodiments.

FIG. 7C illustrates the formation of a first sacrificial layer 716 over dielectric layer 714 and exposed bottom electrodes 712. First sacrificial layer 716 may be subsequently planarized by a planarization process, such as CMP, and then patterned and etched. According to one aspect, first sacrificial layer 716 may be comprised of various materials, such as a metal (e.g., aluminum, aluminum copper, etc.), a polymer (e.g., photoresist, etc.), or an oxide (e.g., silicon oxide, etc.), but is comprised of a material which is selectively removable from a subsequently formed MEMS structure and layer. According to another aspect, the first sacrificial layer may be formed by various conventional techniques and tools, such as by CVD, LPCVD, PVD, plating, evaporation, electron beam evaporation (E-gun), ion beam, energy beam, combinations thereof, and/or other suitable deposition processes.

FIG. 7D illustrates a dielectric layer 720 deposited over dielectric layer 714 and first sacrificial layer 716. Dielectric layer 720 is subsequently patterned and etched and/or planarized to expose first sacrificial layer 716. According to one aspect, dielectric layer 720 is comprised of the same material as dielectric layers 704, 708, and 714, such as silicon oxide in one example, but may be comprised of a different material in other embodiments.

FIG. 7E-2 is a cross-sectional view of MEMS device 700 along line IV-IV in FIG. 7E-1, which illustrates a top view of MEMS device 700 at a stage of fabrication. FIGS. 7E-1 and 7E-2 illustrate the formation of vias 718 above vias 710. Vias 718 may be formed by patterning and etching the dielectric layer 720 and then depositing a via material in the etched locations. Vias 718 may be formed of various metals and may comprise the same or different metal as vias 710. A subsequent planarization process may be utilized.

FIG. 7F-2 is a cross-sectional view of MEMS device 700 along line IV-IV in FIG. 7F-1, which illustrates a top view of MEMS device 700 at a stage of fabrication. FIGS. 7F-1 and 7F-2 illustrate the formation of a MEMS layer 722 and a subsequent patterned etch of the MEMS layer 722 to form MEMS layer sections 722a,, 722b,, 722c,, 722e,, a MEMS structure 722d,, and a first release aperture 723 at substantially the same level above the first sacrificial layer 716 as the MEMS structure 722d. Various conventional patterning and etch techniques and tools may be used for the patterned etch of the MEMS layer 722. In one example, an etcher with a fluorinated etchant gas may be used in conjunction with a patterned photoresist for the patterned etch of the MEMS layer 722. In another example, deep reactive-ion etching may be used to form the openings and the first release aperture 723 in the MEMS layer 722. Other manufacturing techniques may be applicable and may be used to pattern the MEMS layer, including photolithography processing and/or etching. According to one aspect, MEMS layer 722 may be comprised of a single material or multiple materials, such as single crystal silicon, polysilicon, amorphous silicon, metal, dielectric, or a combination thereof, which can support a voltage potential. MEMS layer 722 is comprised of a material(s) which is selective from the sacrificial layers which are removed in subsequent processing.

FIG. 7G illustrates the formation of a second sacrificial layer 724 over MEMS structure 722d, and within first release aperture 723. According to one aspect, second sacrificial layer 724 may be comprised of a metal, a polymer, or an oxide. According to another aspect, second sacrificial layer 724 may be comprised of the same material as first sacrificial layer 716. In other aspects, second sacrificial layer 724 may be comprised of a different material than first sacrificial layer 716, but both sacrificial layers can be selectively removed without attacking the MEMS layer and structure. According to another aspect, second sacrificial layer 724 may be deposited by various conventional techniques and tools, such as by chemical vapor deposition (CVD), low pressure CVD (LPCVD), plating, and the like. Second sacrificial layer 724 may subsequently undergo a planarization process, such as by a chemical mechanical polish (CMP) process.

FIG. 7H illustrates a patterned etch of the second sacrificial layer 724 to form trenches 724a, and 724b, over MEMS structure 722d. Various conventional pattern and etch techniques and tools may be used for the patterned etch of the second sacrificial layer 724. In one example, an isotropic oxide etcher with a fluorinated etchant gas may be used in conjunction with a patterned photoresist for the patterned etch of the second sacrificial layer 724.

Figure 7I:
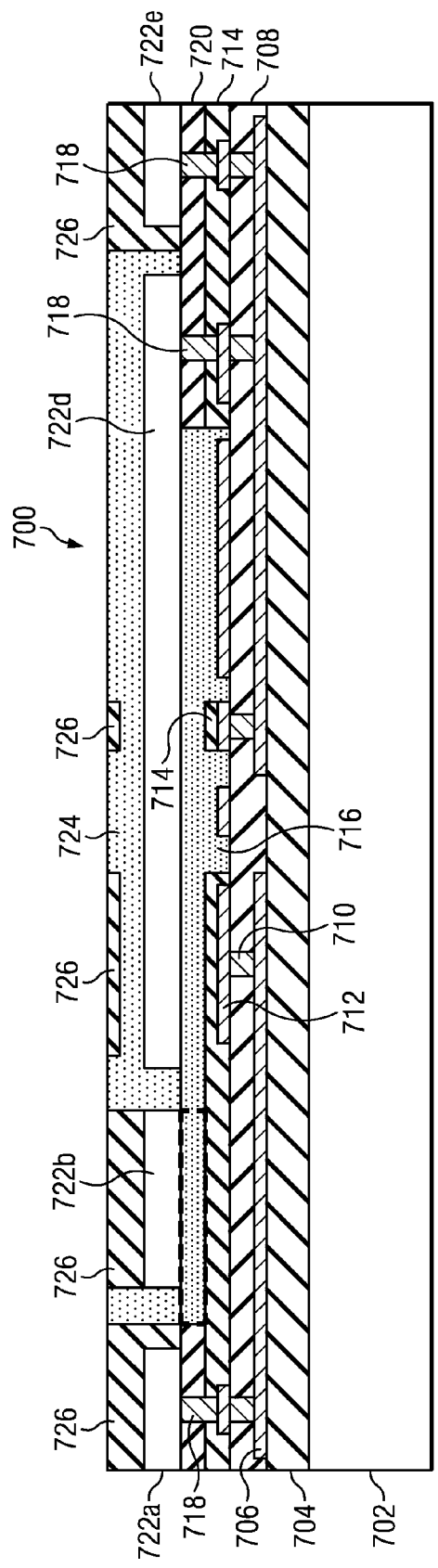

FIG. 7I illustrates the deposition of a dielectric layer 726 over the second sacrificial layer 724, the first release aperture 723, and MEMS layer sections 722a,, 722b,, and 722e. According to one aspect, dielectric layer 726 is comprised of the same material as dielectric layers 704, 708, 714, and 720, such as silicon oxide in one example, but may be comprised of a different material in other embodiments.

Figure 7J:
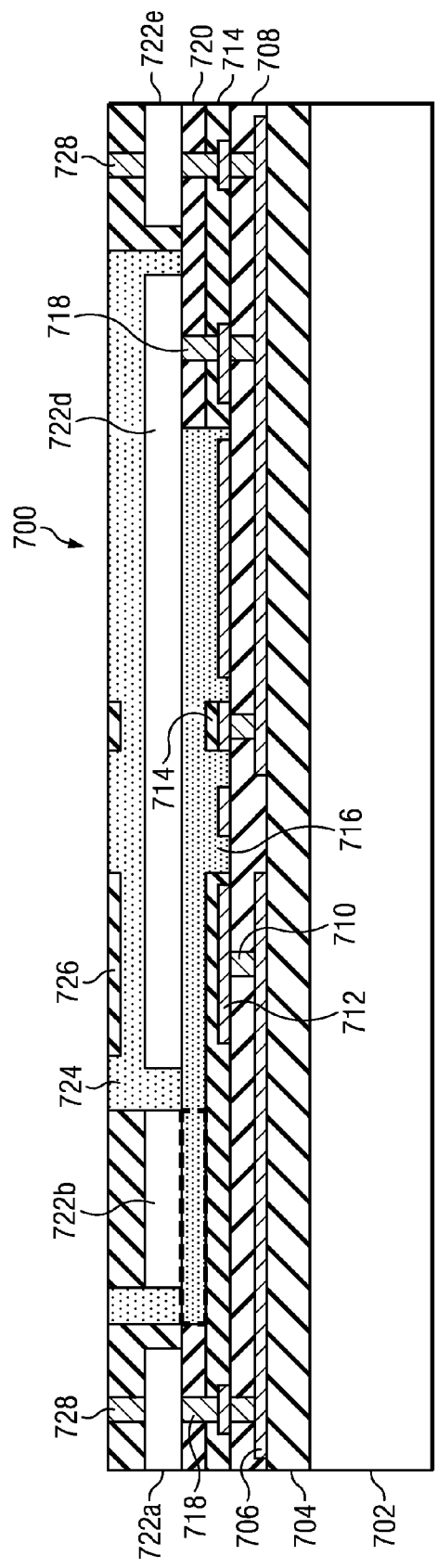

FIG. 7J illustrates the formation of vias 728 through dielectric layer 726. The vias may be formed by an etch through dielectric layer 726 and then a deposition of via material, such as a metal. According to one aspect, vias 728 may be comprised of the same or substantially similar material as vias 718 and 710.

Figure 7K:
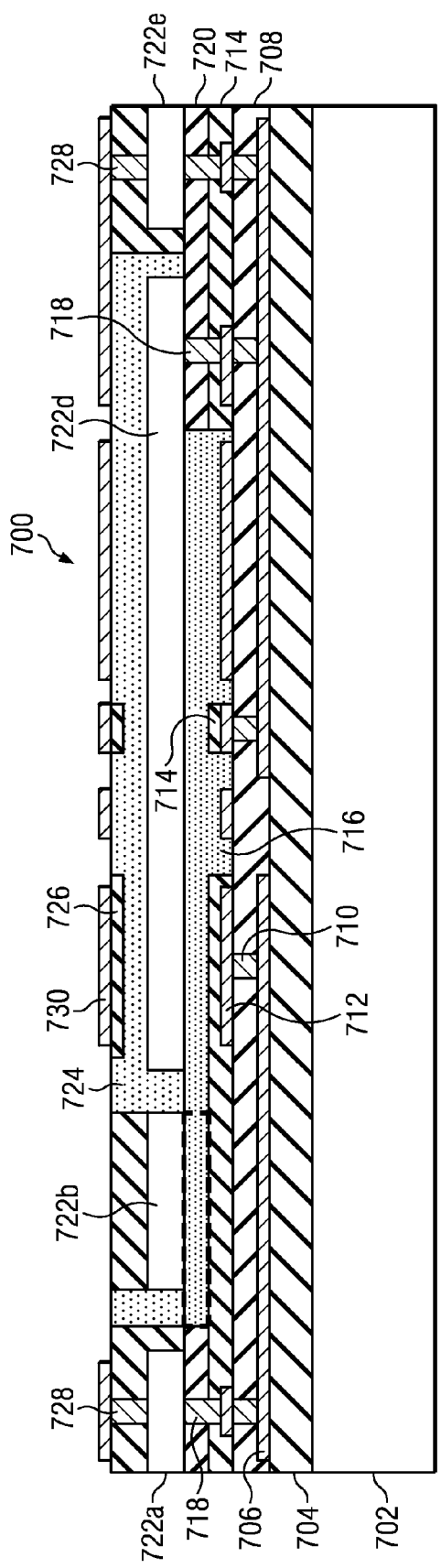

FIG. 7K illustrates the formation of top electrodes 730, such as a top signal electrode and a top actuation electrode. Top electrodes 730 may be comprised of various materials, such as a metal, and may be formed by various techniques and tools, such as by PVD, plating, and/or the like.

Figure 7L:
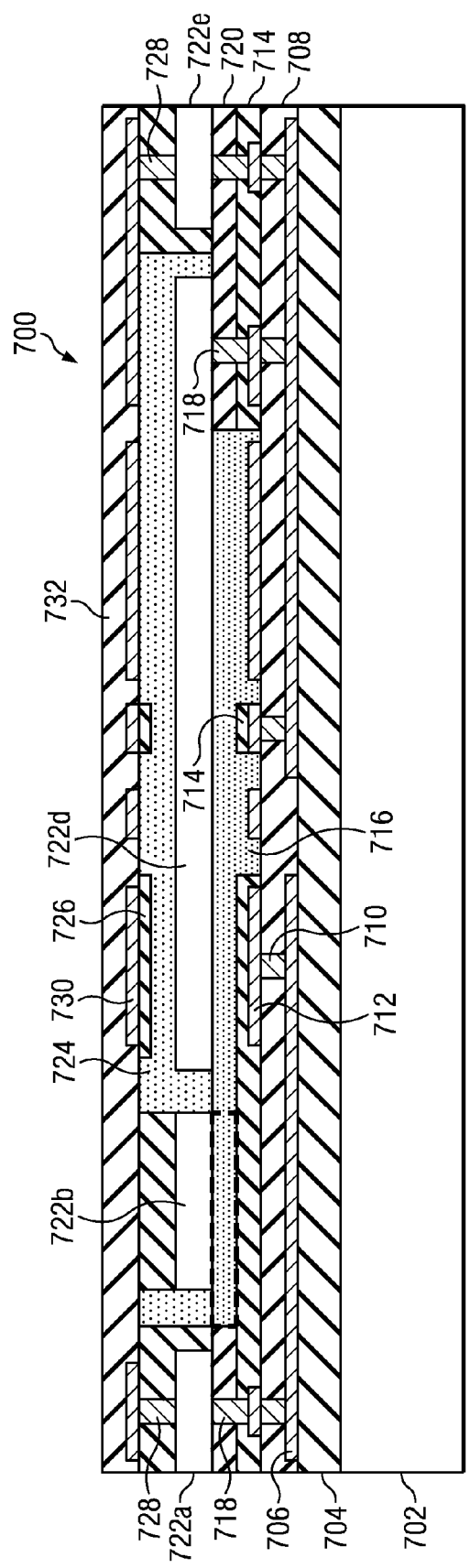

FIG. 7L illustrates the formation of a dielectric layer 732 over the top electrodes 730, second sacrificial layer 724, and dielectric layer 726 to isolate the top electrodes 730. According to one aspect, dielectric layer 732 may be comprised of the same or substantially similar material as dielectric layers 726, 720, 714, 708, and 704, such as silicon oxide in one example, but may be comprised of a different material in other embodiments.

Figure 7M:
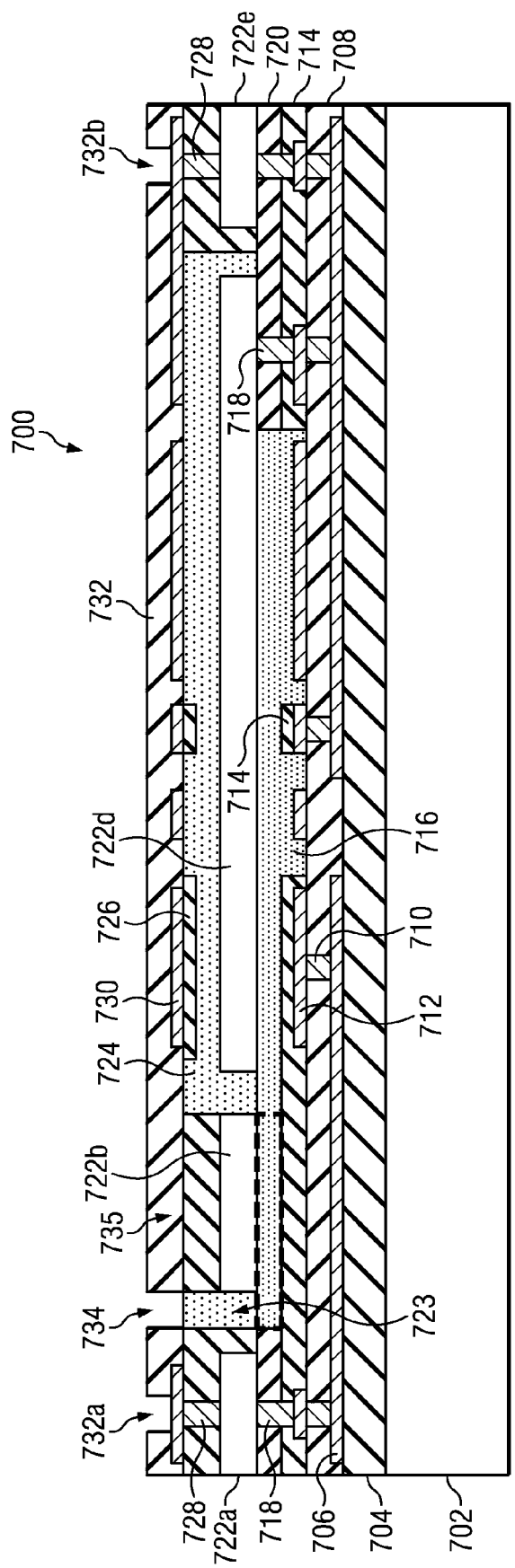

FIG. 7M illustrates the patterned etch of dielectric layer 732 to form openings 732a, 732b, over respective vias 728 and to form a second release aperture 734 over the second sacrificial layer 724 and the first release aperture 723. According to one aspect, the diameter of the second release aperture 734 is advantageously made small, and is less than 1.5 microns in one example. Openings 732a,, 732b, and second release aperture 734 may be formed by various conventional patterning and etch techniques and tools. Dielectric layers 732 and 726 may be considered a cap packaging, capping structure, or cap over MEMS structure 722d. The cap of dielectric layers 732 and 726 includes a leg 735 which is disposed between the MEMS structure 722d, and the second release aperture 734.

Figure 7N:
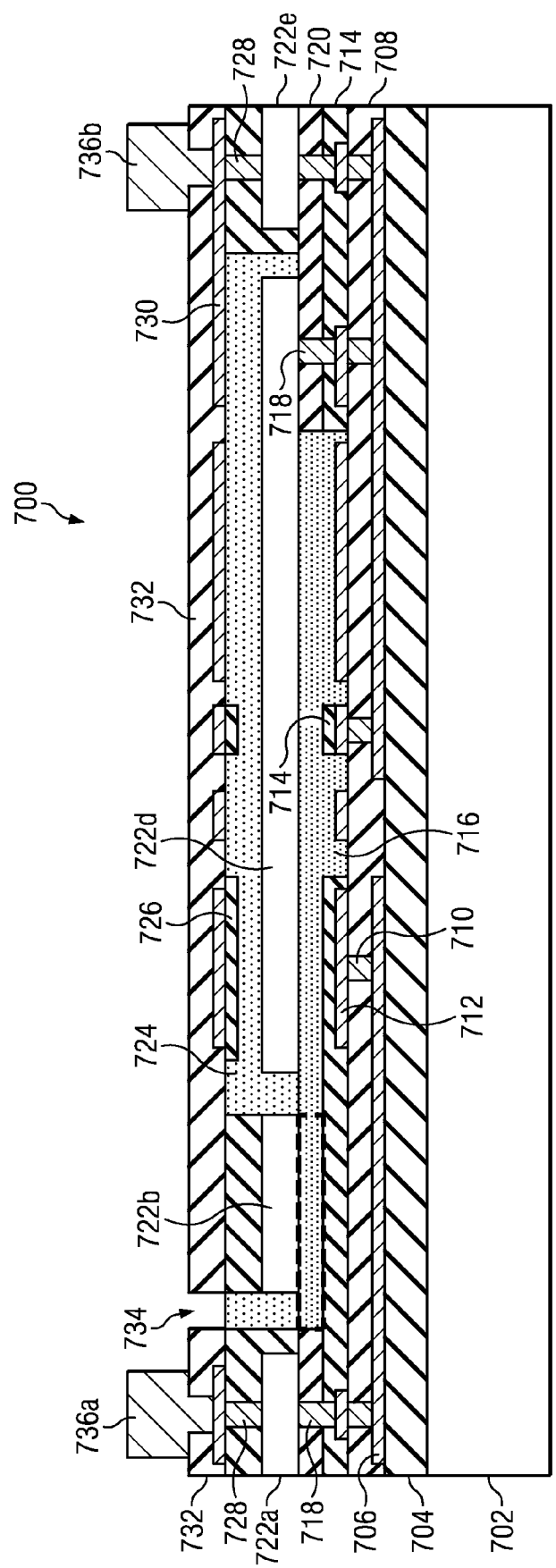

FIG. 7N illustrates the formation of metal pads 736a,, 736b, over respective vias 728 and the electrical coupling of metal pads 736a,, 736b, to respective top electrodes 730 and/or bottom electrodes 706. Metal pads 736a,, 736b, may be formed of various metals by various deposition and etch techniques.

Figure 7O:
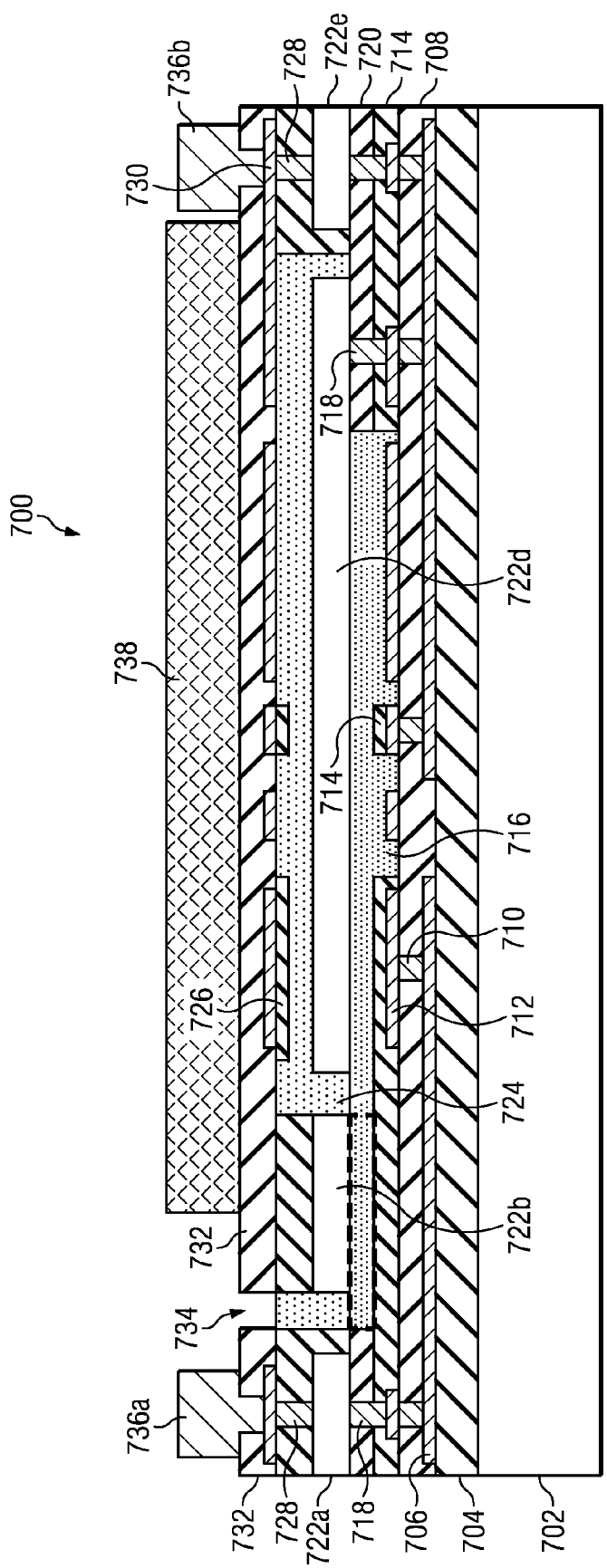

FIG. 7O illustrates the formation of a reinforcement layer 738 over dielectric layer 732 and MEMS structure 722d. According to one aspect, reinforcement layer 738 is formed and patterned over the MEMS structure and cap packaging to improve the mechanical strength of the MEMS device packaging. Reinforcement layer 738 may be comprised of various materials, such as a metal, a dielectric, etc., and may be formed by various techniques and tools, such as by film deposition, electrode plating, etc.

Figure 7P:
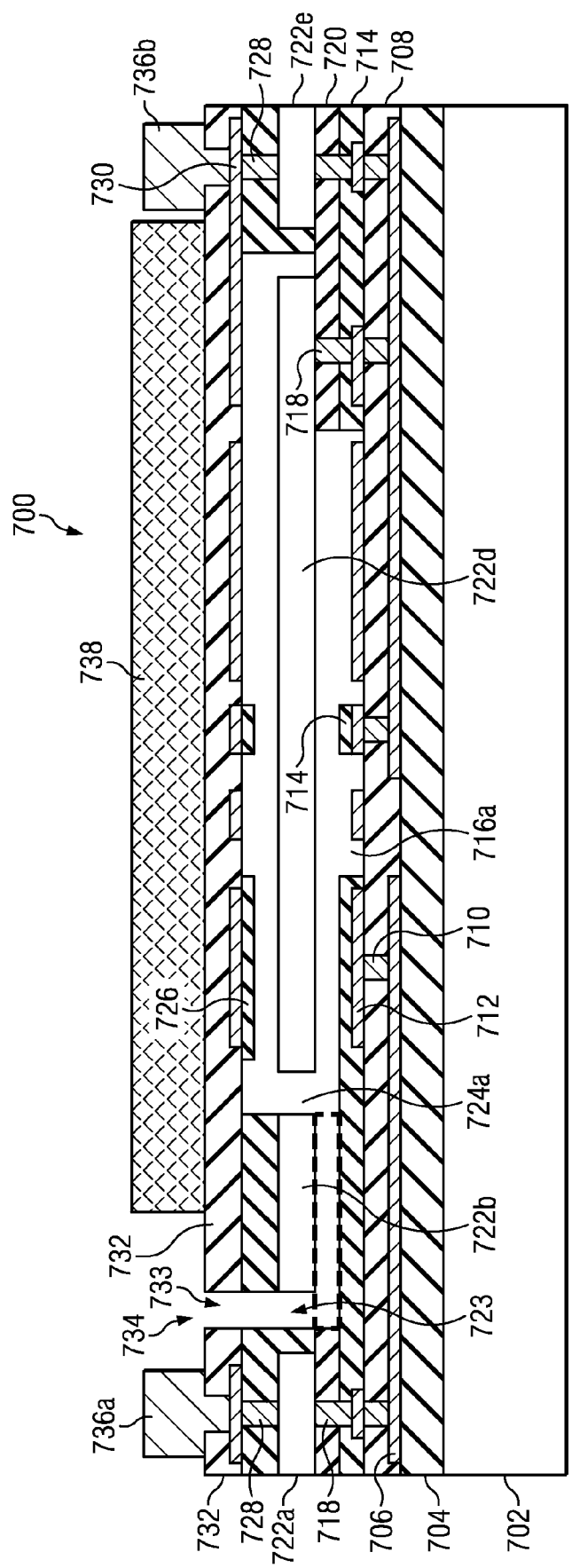

FIG. 7P illustrates the removal of the first and second sacrificial layers 716 and 724, respectively, by a selective etch through the second release aperture 734 and first release aperture 723, thus releasing the MEMS structure 722d. The selective etch may be one of various conventional techniques, such as by a vapor HF etch. The removal of the first and second sacrificial layers 716 and 724 leaves first and second sacrificial layer openings 716a, and 724a, respectively, such that MEMS structure 722d, is released within a cavity created by the first and second sacrificial layer openings 716a, and 724a. Advantageously, a release trench 733, comprised of the first and second release apertures 723 and 734 and the passageway through dielectric layer 726 after removal of the second sacrificial layer, is located apart from the MEMS structure 722d, at substantially the same level above first sacrificial layer opening 716a,, and the second sacrificial layer (and optionally the first sacrificial layer) is removed underneath and to the side of the cap structure and the MEMS structure 722d. Advantageously, since the cap packaging does not include a release aperture but is mechanically and materially continuous without a discontinuity, the likelihood of contamination during subsequent processing is reduced while the structural strength of the cap packaging over the MEMS structure is increased.

Figure 7Q:
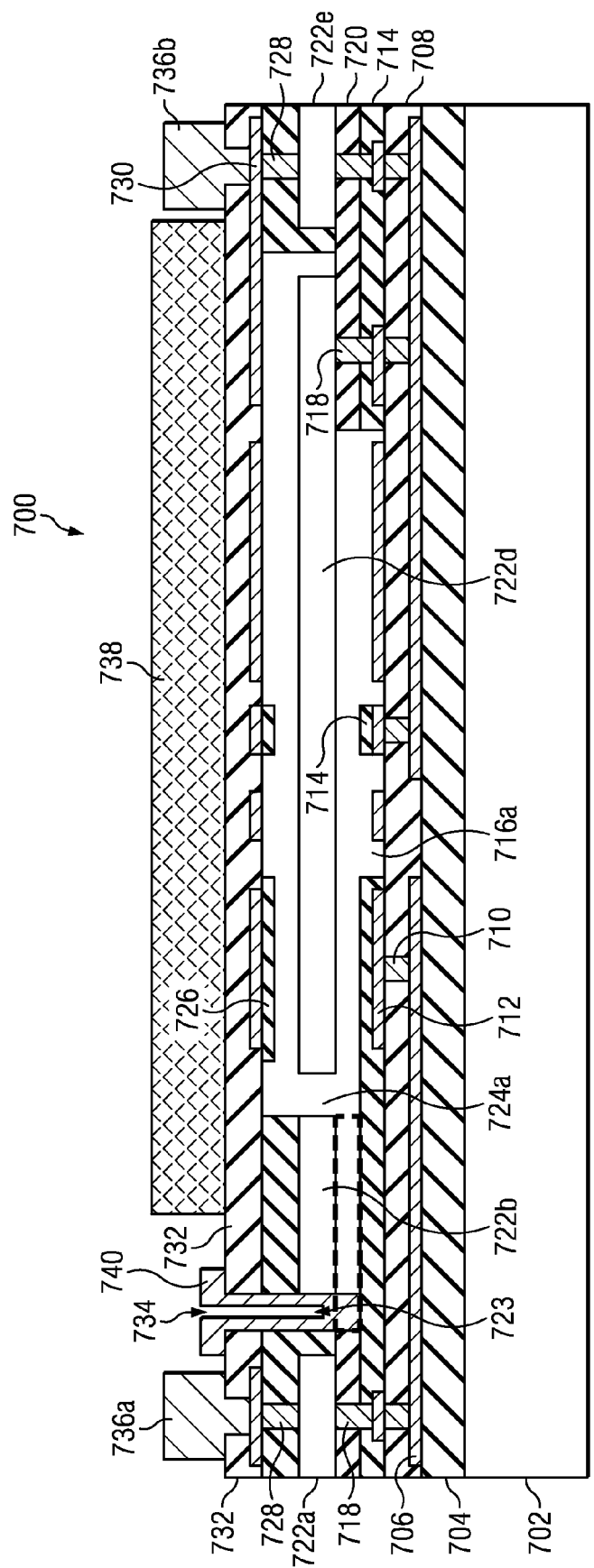

FIG. 7Q illustrates the formation of a second cap 740 over dielectric layers 732 and 726 and within second release aperture 734, such that second cap 740 plugs the second release aperture 734. In this embodiment, second cap 740 plugs both the second and first release apertures 734 and 723 to plug the entire release trench walls comprised of the first and second release apertures and the spacing provided within dielectric layers 726 and 732 from the removed first and second sacrificial layers.

Figure 7R:
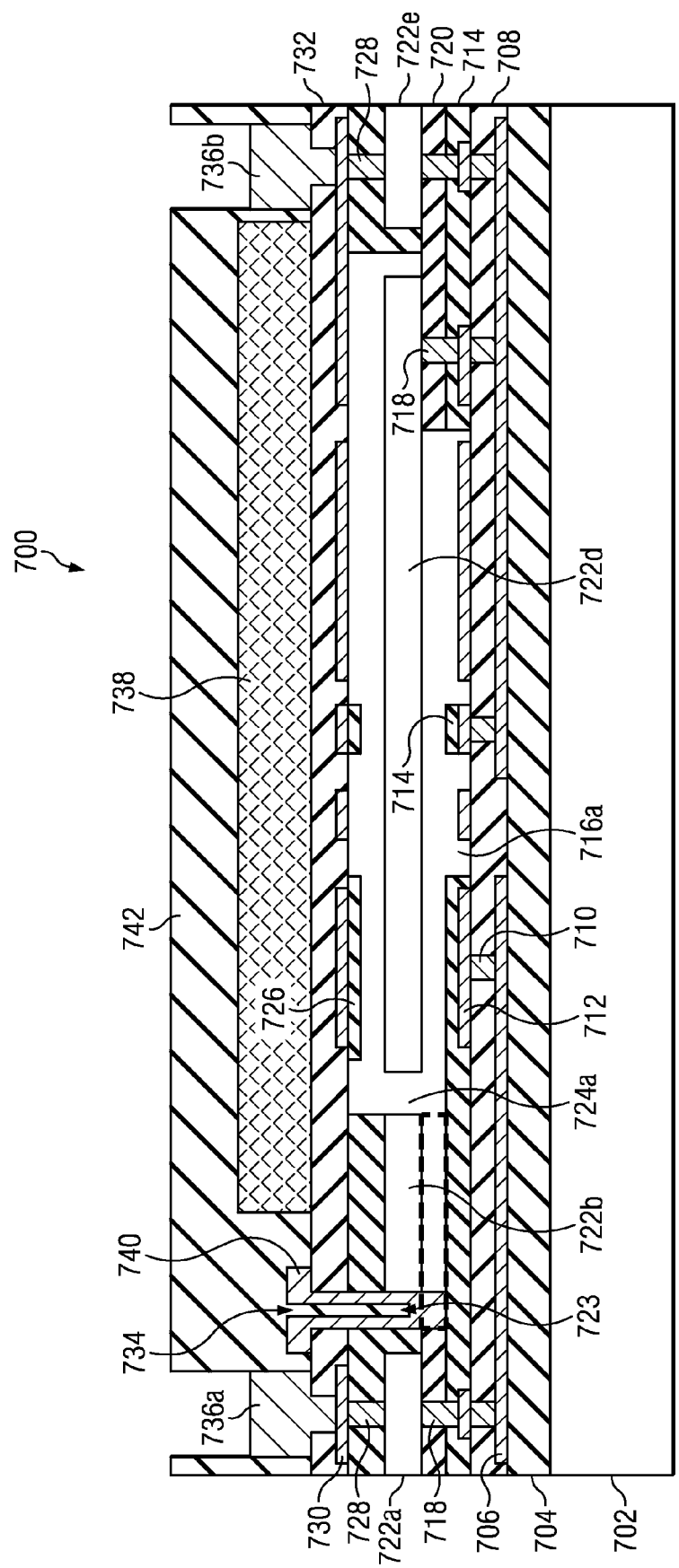

FIG. 7R illustrates the formation of a passivation layer 742 over second cap 740, reinforcement layer 738, and metal pads 736a,, 736b. A subsequent etch of the passivation layer 742 exposes the metal pads 736a,, 736b. According to one aspect, passivation layer 742 may be comprised of various materials and may be deposited by various methods. In one example, passivation layer 742 may be formed by film deposition and subsequently etched.

Figure 8A:
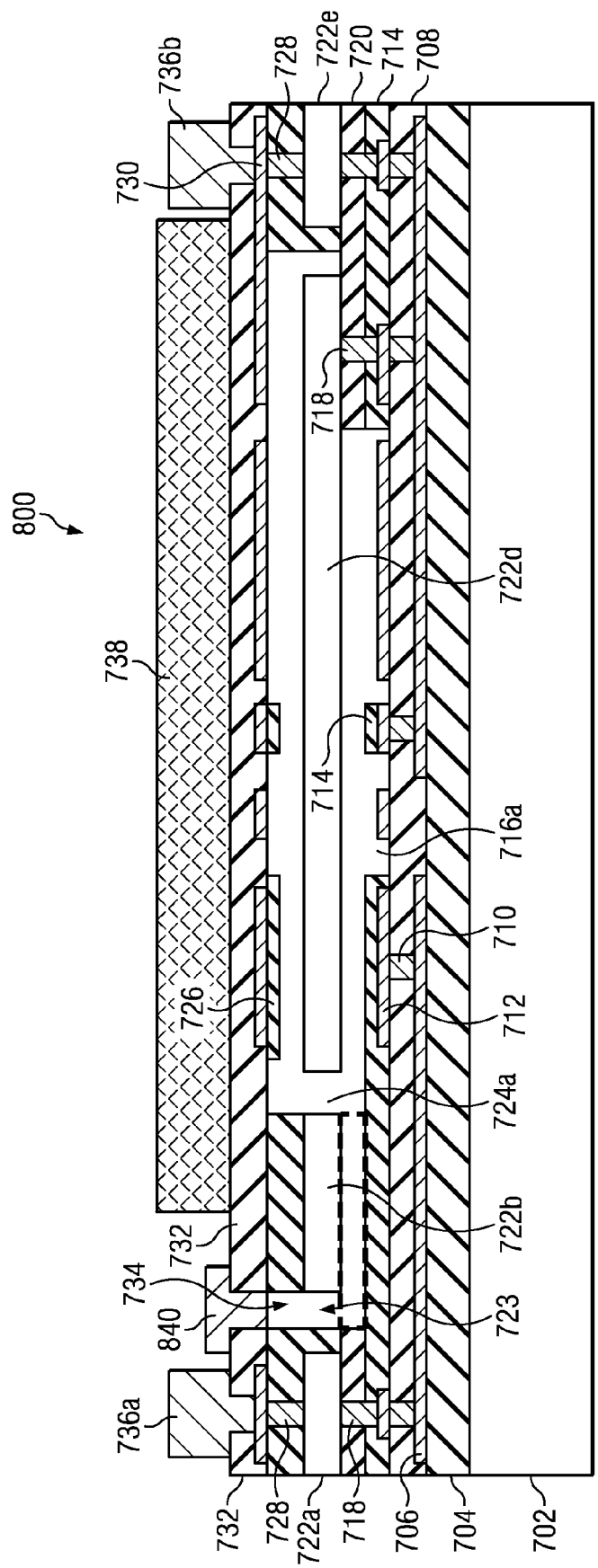
FIGS. 8A and 8B are cross-sectional views of a MEMS device at various stages of fabrication in accordance with another embodiment of the present disclosure.
Figure 8B:
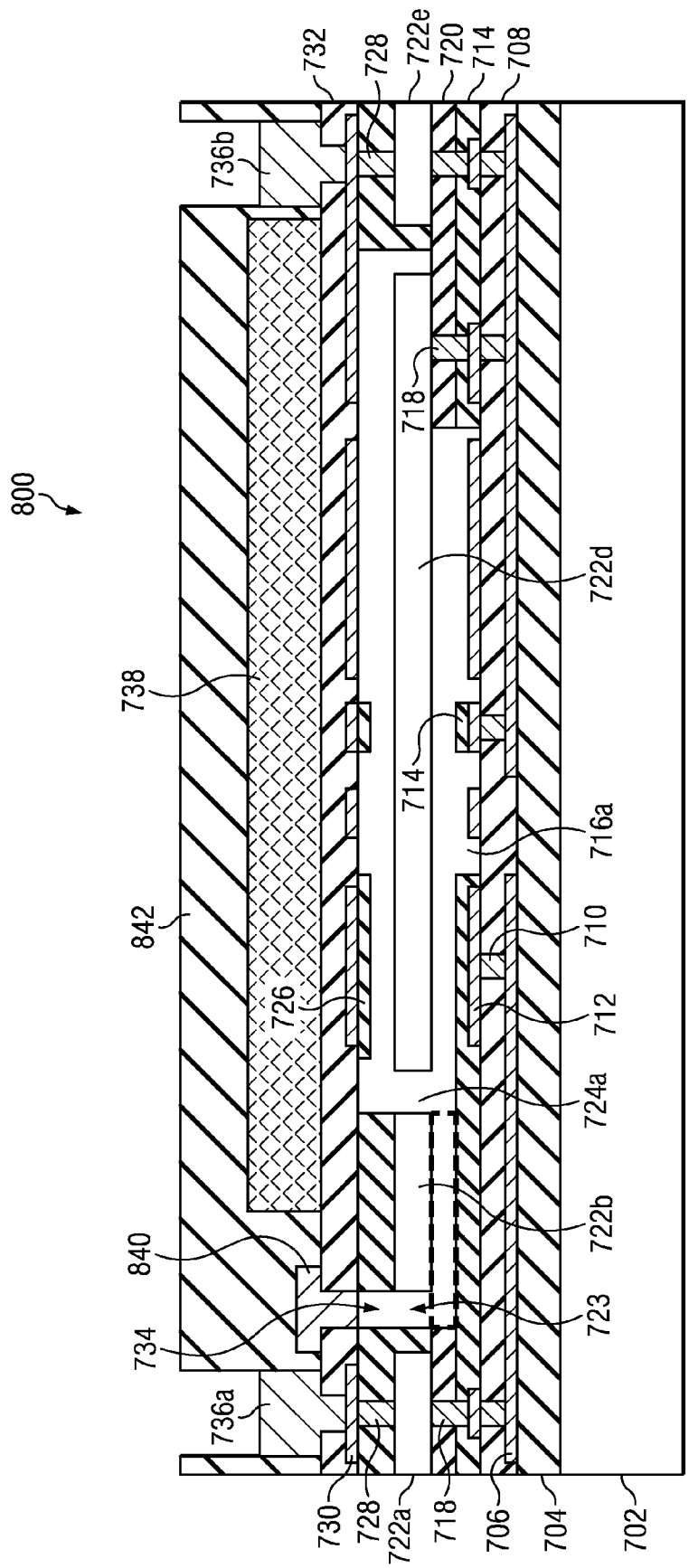

Referring now to FIGS. 8A and 8B, cross-sectional views of a MEMS device 800 at various stages of fabrication are illustrated in accordance with another embodiment of the present disclosure. MEMS device 800 is substantially similar to MEMS device 700 and includes the same or substantially similar elements as MEMS device 700 as described above with respect to FIGS. 7A-7R. Descriptions of the same or substantially similar elements may not be included here to avoid prolix description although such descriptions are fully applicable in this embodiment as well.

FIG. 8A illustrates the formation of a second cap 840 over dielectric layers 732 and 726 and within second release aperture 734, such that second cap 740 plugs the second release aperture 734 only and not first release aperture 723.

FIG. 8B illustrates the formation of a passivation layer 842 over second cap 840, reinforcement layer 738, and metal pads 736a,, 736b. A subsequent etch of the passivation layer 742 exposes the metal pads 736a,, 736b.

Advantageously, the fabrication method and MEMS devices 700 and 800 described above may be easily integrated with standard CMOS backend bump, packaging, and testing processes. Furthermore, the present disclosure allows for a simplified MEMS packaging process including the fabrication of bottom and top electrodes, a lower device footprint compared to a conventional bonding packaging process, and more accurate air gap and overlay control (or capacitance control) for the integration scheme of both the top and bottom electrodes. The reinforcement layer over the MEMS structure and the MEMS packaging allows for enlargement of the packaging and for mechanical strength to survive a subsequent molding process of CMOS standard packaging.

Thus, the present disclosure provides a method for fabricating a micro-electro-mechanical systems (MEMS) device. In one embodiment, a method includes providing a substrate including a first sacrificial layer, forming a micro-electromechanical systems (MEMS) structure above the first sacrificial layer, and forming a release aperture at substantially a same level above the first sacrificial layer as the MEMS structure. The method further includes forming a second sacrificial layer above the MEMS structure and within the release aperture, and forming a first cap over the second sacrificial layer and the MEMS structure, wherein a leg of the first cap is disposed between the MEMS structure and the release aperture. The method further includes removing the first sacrificial layer, removing the second sacrificial layer through the release aperture, and plugging the release aperture.

The present disclosure provides another method for fabricating a MEMS device. In one embodiment, a method includes providing a substrate including a bottom electrode and a first sacrificial layer above the bottom electrode, and forming a micro-electro-mechanical systems (MEMS) structure and a first release aperture set apart from the MEMS structure, the MEMS structure and the first release aperture disposed at substantially a same level above the first sacrificial layer. The method further includes forming a second sacrificial layer over the MEMS structure and within the first release aperture, forming a top electrode above the second sacrificial layer, and forming a first cap over the top electrode, the second sacrificial layer, and the MEMS structure, wherein a leg of the first cap is disposed between the MEMS structure and a second release aperture above the first release aperture. The method further includes removing the first and second sacrificial layers through the first and second release apertures, and plugging the second release aperture with a second cap.

The present disclosure also provides a semiconductor device. In one embodiment, the device includes a substrate, a micro-electro-mechanical systems (MEMS) structure disposed above a first sacrificial layer opening above the substrate, and a release aperture disposed at substantially a same level above the first sacrificial layer opening as the MEMS structure. The device further includes a first cap over the MEMS structure and a second sacrificial layer opening, wherein a leg of the first cap is disposed between the MEMS structure and the release aperture, and a second cap plugging the release aperture.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method, comprising:
providing a substrate including a first sacrificial layer;
forming a micro-electro-mechanical systems (MEMS) structure above the first sacrificial layer;
forming a first release aperture at substantially a same level above the first sacrificial layer as the MEMS structure;
forming a second sacrificial layer above the MEMS structure and within the first release aperture;
forming a first cap over the second sacrificial layer and the MEMS structure, a leg of the first cap disposed between the MEMS structure and a second release aperture above the first release aperture;
removing the first and second sacrificial layers through the first and second release apertures; and
plugging the second release aperture.

2. The method of claim 1, wherein the second release aperture is formed to have a diameter of less than 1.5 microns.

3. The method of claim 1, further comprising patterning the second sacrificial layer to form trenches over the MEMS structure.

4. The method of claim 3, further comprising depositing a dielectric layer in the trenches and the first release aperture.

5. The method of claim 4, further comprising forming top electrodes over the dielectric layer and second sacrificial layer.

6. The method of claim 1, further comprising forming a reinforcement layer over the MEMS structure.

7. The method of claim 6, further comprising forming a passivation layer over the reinforcement layer.

8. The method of claim 1, wherein the second release aperture is plugged with a second cap and the second cap plugs both the first and second release apertures.

9. The method of claim 1, further comprising forming a bottom electrode below the MEMS structure.

10. A method, comprising:
forming a first sacrificial layer;
forming a micro-electro-mechanical systems (MEMS) structure above the first sacrificial layer;
forming a first release aperture;
forming a second sacrificial layer above the MEMS structure and within the first release aperture;
forming a second release aperture above the first release aperture;
forming a first cap over the second sacrificial layer and the MEMS structure, a leg of the first cap disposed between the MEMS structure and the second release aperture;
removing the first and second sacrificial layers through the first and second release apertures; and
plugging the second release aperture.

11. The method of claim 10, wherein the second release aperture is formed to have a diameter of less than 1.5 microns.

12. The method of claim 10, further comprising patterning the second sacrificial layer to form trenches over the MEMS structure.

13. The method of claim 12, further comprising depositing a dielectric layer in the trenches and the first release aperture.

14. The method of claim 10, further comprising forming a bottom electrode and a top electrode below and above the MEMS structure, respectively.

15. The method of claim 10, further comprising forming a reinforcement layer over the MEMS structure and a passivation layer over the reinforcement layer.

16. The method of claim 1, wherein the second release aperture is plugged with a second cap and the second cap plugs both the first and second release apertures.

17. A method, comprising:
providing a substrate including a bottom electrode and a first sacrificial layer above the bottom electrode;
forming a micro-electro-mechanical systems (MEMS) structure and a first release aperture set apart from the MEMS structure, the MEMS structure and the first release aperture disposed at substantially a same level above the first sacrificial layer;
forming a second sacrificial layer over the MEMS structure and within the first release aperture;
forming a top electrode above the second sacrificial layer;
forming a first cap over the top electrode, the second sacrificial layer, and the MEMS structure, a leg of the first cap disposed between the MEMS structure and a second release aperture above the first release aperture;
removing the first and second sacrificial layers through the first and second release apertures; and
plugging the second release aperture with a second cap.

18. The method of claim 17, wherein the second release aperture is formed to have a diameter between about 0.5 micron and about 2 micron.

19. The method of claim 17, further comprising forming a reinforcement layer over the MEMS structure and a passivation layer over the reinforcement layer and the second cap.

20. The method of claim 17, further comprising plugging the first release aperture and the second release aperture with the second cap.

* * * * *